United States Patent
Abe et al.

(10) Patent No.: US 8,203,146 B2
(45) Date of Patent: *Jun. 19, 2012

(54) INTEGRATED CIRCUITS UTILIZING AMORPHOUS OXIDES

(75) Inventors: Katsumi Abe, Kawasaki (JP); Hideo Hosono, Yokohama (JP); Toshio Kamiya, Yokohama (JP); Kenji Nomura, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/882,404

(22) Filed: Sep. 15, 2010

(65) Prior Publication Data

US 2011/0024741 A1 Feb. 3, 2011

Related U.S. Application Data

(62) Division of application No. 11/269,646, filed on Nov. 9, 2005, now Pat. No. 7,863,611.

(30) Foreign Application Priority Data

Nov. 10, 2004 (JP) ................................. 2004-326685

(51) Int. Cl.
*H01L 31/20* (2006.01)
(52) U.S. Cl. ............... 257/58; 257/59; 257/62; 257/72; 257/E29.083; 257/E29.092; 257/E29.101
(58) Field of Classification Search ..................... 257/58, 257/59, 62, 72, 52, E29.083, E29.092, E29.101
See application file for complete search history.

(56) References Cited

U.S. PATENT DOCUMENTS

| | | | |
|---|---|---|---|
| 6,075,256 A | 6/2000 | Kaifu et al. | 257/53 |
| 6,909,114 B1 * | 6/2005 | Yamazaki | 257/66 |
| 7,189,992 B2 | 3/2007 | Wager, III et al. | 257/43 |
| 7,791,072 B2 | 9/2010 | Kumomi et al. | 257/59 |
| 7,863,611 B2 * | 1/2011 | Abe et al. | 257/58 |
| 2003/0218222 A1 | 11/2003 | Wager, III et al. | 257/430 |
| 2005/0173734 A1 | 8/2005 | Yoshioka et al. | 257/202 |
| 2005/0199959 A1 | 9/2005 | Chiang et al. | 257/368 |
| 2006/0108529 A1 | 5/2006 | Saito et al. | 250/338.4 |
| 2006/0110867 A1 | 5/2006 | Yabuta et al. | 438/151 |
| 2006/0113536 A1 | 6/2006 | Kumomi et al. | 257/57 |
| 2006/0113539 A1 | 6/2006 | Sano et al. | 257/59 |
| 2006/0113549 A1 | 6/2006 | Den et al. | 257/79 |

FOREIGN PATENT DOCUMENTS

JP 05-251705 9/1993
(Continued)

OTHER PUBLICATIONS

Nomura et al., "Room-temperature Fabrication of Transparent Flexible Thin-film Transistors Using Amorphous Oxide Semiconductors," *Nature*, vol. 432, 488-492 (2004).

(Continued)

*Primary Examiner* — Minchul Yang
(74) *Attorney, Agent, or Firm* — Fitzpatrick, Cella, Harper & Scinto

(57) ABSTRACT

Semiconductor devices and circuits with use of transparent oxide film are provided. The semiconductor device having a P-type region and an N-type region, wherein amorphous oxides with electron carrier concentration less than $10^{18}/cm^3$ is used for the N-type region.

14 Claims, 22 Drawing Sheets

FOREIGN PATENT DOCUMENTS

| | | |
|---|---|---|
| JP | 08-032094 | 2/1996 |
| JP | 2000-44236 | 2/2000 |
| JP | 2000-228516 A | 8/2000 |
| JP | 2003-298062 | 10/2003 |
| JP | 2004-103957 | 4/2004 |
| WO | WO 03/098699 | 11/2003 |
| WO | WO 2004/038757 | 5/2004 |
| WO | WO 2005/088726 | 9/2005 |
| WO | WO 2005/093846 | 10/2005 |
| WO | WO 2005/093847 | 10/2005 |
| WO | WO 2005/093848 | 10/2005 |
| WO | WO 2005/093849 | 10/2005 |
| WO | WO 2005/093850 | 10/2005 |
| WO | WO 2005/093851 | 10/2005 |
| WO | WO 2005/093852 | 10/2005 |
| WO | WO 2006/051993 | 5/2006 |
| WO | WO 2006/051994 | 5/2006 |
| WO | WO 2006/051995 | 5/2006 |

OTHER PUBLICATIONS

Takagi et al., "Carrier Transport and Electronic Structure in Amorphous Oxide Semiconductor, a-InGaZnO$_4$," *Thin Solid Films*, vol. 486, 38-41 (2005).

Nomura et al., "Thin-Film Transistor Fabricated in Single-Crystalline Transparent Oxide Semiconductor," *Science*, vol. 300, 1269-1272 (2003).

Nomura et al., "Carrier Transport in Transparent Amorphous Oxide Semiconductor InGaZnO$_4$", Preprint 31a-ZA-6 of 51th Meeting of Union of Applied Phys. Soc., Mar. 2004, Tokyo University of Technology.

Kamiya et al., "Room Temperature Fabrication and Carrier Transport . . . (>10 cm$^2$/Vs)", Preprint 1a-F-5 of 65$^{th}$ Meeting of Appl. Phys. Soc., Sep. 2004, Tohoku Gakuen University.

Narushima et al., "A p-Type Amorphous Oxide Semiconductor and Room Temperature Fabrication of Amorphous Oxide p-n Heterojunction Diodes", *Advanced Materials*, vol. 15, No. 17, pp. 1409-1413 (2003).

Fortunato, "Wide Bandgap High Mobility ZnO Thin Film Transistors Produced at Room Temperature", Appl. Phys. Lee., 85, 2004, pp. 2541-2543.

Office Action in Japanese Patent Application No. 2005-325370 (Jan. 25, 2012) (5 pages).

* cited by examiner

INTEGRATED CIRCUITS UTILIZING AMORPHOUS OXIDES

CROSS-REFERENCE TO RELATED APPLICATION

This application is a division of U.S. patent application Ser. No. 11/269,646, filed on Nov. 9, 2005, now U.S. Pat. No. 7,863,611 which claims the benefit of Japanese Patent Application No. 2004-326685, filed on Nov. 10, 2004. The contents of the aforementioned applications are incorporated herein by reference in their entireties.

BACKGROUND OF THE INVENTION

1. Field of the Invention

The present invention relates to electric elements and circuits utilizing amorphous oxides. In particular, it relates to semiconductor devices utilizing amorphous oxides.

2. Description of Related Art

In recent years, advance in liquid crystal and ElectroLuminescence (EL) technology brought flat and thin image displaying apparatuses (Flat Panel Display: FPD) into practicalization. These FPDs are driven by an active matrix circuit of an electric field effect type thin film transistor (Thin Film Transistor: TFT) using, for an active layer, amorphous silicon thin film or multi-crystallized silicon thin film provided on a glass substrate.

On the other hand, being after improvement in further thin formation, light weight and destruction resistivity of these FPDs, use of a light and flexible resin substrate instead of a glass substrate is having been tried. However, for manufacturing a transistor using the silicon thin film, comparatively high temperature heating process is required, and in general it is difficult to form it directly onto a resin substrate having low heat resistance. Therefore, development of TFTs using oxide semiconductor thin film with for example ZnO as material that can undergo film deposition at a low temperature is being energetically implemented (Japanese Patent Application Laid-Open No. 2003-298062).

Thus, novel semiconductor devices are expected.

SUMMARY OF THE INVENTION

An object of the present invention is to provide a variety of semiconductor devices utilizing amorphous oxides and circuits etc. using them. A semiconductor related to the present invention comprises P-type region and an N-type region, wherein amorphous oxides with electron carrier concentration less than $1 \times 10^{18}/cm^3$ is used for the N-type region.

In the present invention, the semiconductor device is, for example, a PN-junction type transistor.

In addition, a P-type semiconductor having an absolute value of Fermi level being larger than the absolute value of Fermi level of the amorphous oxides in the N-type region can be used as material in the P-type region.

In addition, the present invention is featured by, on a substrate, provision of the N-type region in the P-type region or provision of the P-type region in the N-type region.

In addition, a semiconductor device related to the present invention comprises a P-type region and an N-type region, wherein amorphous oxides showing tendency of electron mobility to increase as electron carrier concentration increases are used for the N-type region.

In addition, the present invention is featured by the P-type region and the N-type region being formed in the same layer on a substrate.

In addition, static induction transistor related to the present invention is featured by use of amorphous oxides with electron carrier concentration less than $1 \times 10^{18}/cm^3$ as electron conductive material.

In addition, a Schottky barrier type transistor related to the present invention is featured by use of amorphous oxides with electron carrier concentration less than $1 \times 10^{18}/cm^3$ as electron conductive material.

In addition, a Schottky diode related to the present invention is featured by use of amorphous oxides with electron carrier concentration less than $1 \times 10^{18}/cm^3$ as electron conductive material.

In addition, a resistance element related to the present invention is featured by use of amorphous oxides with electron carrier concentration less than $1 \times 10^{18}/cm^3$ as electron conductive material.

In addition, an integrated circuit related to the present invention is featured by employing as a component a circuit including an N-type TFT using as an N-type semiconductor amorphous oxides with electron carrier concentration less than $1 \times 10^{18}/cm^3$.

In addition, an integrated circuit related to the present invention is featured by using the N-type TFT in at least any of logic circuit, memory circuit and differential amplifier circuit.

Moreover, a semiconductor device of the present invention is featured by comprising a first region consisting of amorphous oxides with electron carrier concentration less than $1 \times 10^{18}/cm^3$ and a second region forming a heterojunction to the first region.

And a semiconductor device of the present invention is featured by comprising a first region consisting of amorphous oxides showing tendency of electron mobility to increase as electron carrier concentration increases and a second region forming a heterojunction to the first region.

Incidentally, the present inventor studied oxide semiconductors to find out that ZnO generally could not form a stable amorphous phase. And, it seems that, since most of ZnO presents a polycrystalline phase, carriers undergo dispersion on the interface between polycrystalline particles and consequently electron mobility cannot be made to increase.

In addition, ZnO is apt to incur oxygen defects and gives rise to a great number of carrier electrons, making it difficult to reduce electric conductivity. Thereby, it was found out that, even at the time when no gate voltage of a transistor was applied, a large current would flow between a source terminal and a drain terminal, making it impossible to realize normally OFF operations of a TFT. In addition, it also seems difficult to increase ON•OFF proportion of a transistor.

In addition, the present inventors studied amorphous oxide film $Zn_xM_yIn_zO_{(x+3y/2+3z/2)}$ (in the formula, M is at least one element selected from the group consisting of Al and Ga) described in Japanese Patent Application Laid-Open No. 2000-044236. This material has electron carrier concentration not less than $1 \times 10^{18}/cm^3$ and is suitable material as a simple transparent electrode.

However, oxides with electron carrier concentration not less than $1 \times 10^{18}/cm^3$ were found out to be inappropriate for a normally OFF type TFT in case of use for the channel layer of a TFT without sufficient ON•OFF proportion being retainable.

That is, with conventional amorphous oxide film, film with electron carrier concentration less than $1 \times 10^{18}/cm^3$ has not yet been made available.

Under the circumstances, the present inventors made as an active layer of an electric field effect type transistor a TFT with use of amorphous oxides with electron carrier concentration less than $1\times10^{18}/cm^3$ to find out that a TFT with desired features can be derived. Furthermore, such amorphous oxides were found out to be suitably usable also to semiconductor devices other than TFTs.

The present inventors energetically proceeded with research and development on $InGaO_3(ZnO)_m$ as well as film deposition conditions for this material and, as a result, found out that control of conditions of oxygen atmosphere at the time of film deposition could derive electron carrier concentration less than $1\times10^{18}/cm^3$.

Moreover, such amorphous oxides were found out to be suitably usable also to a semiconductor device other than TFTs.

The present invention relates to a novel semiconductor device. In addition, electric elements described as follows are covered by the present invention.

The present invention relates to a static induction transistor (hereinafter to be referred to as SIT), comprising at least In, Ga, Zn and O as components, wherein transparent amorphous oxide thin film with electron carrier concentration less than $1\times10^{18}/cm^3$ is used as electron conductive material.

The present invention relates to a Schottky Barrier Transistor (hereafter to be referred to as SBT), wherein the oxide film is used as electron conduction material.

The present invention relates to a PN-junction transistor (hereinafter to be referred to as PN-T), wherein the oxide film is used as an electron conductive region and a P-type semiconductor with the absolute value of Fermi level being larger than the absolute value of Fermi level of the oxide is used as a gate electrode.

The present invention relates to a Schottky Diode (hereinafter to be referred to as SD), wherein the oxides are used as an N-type semiconductor.

The present invention relates to a PN-junction Diode (hereinafter to be referred to as PN-D), wherein the oxides are used as an N-type semiconductor, and a P-type semiconductor with the absolute value of Fermi level being larger than the absolute value of Fermi level of the oxides is used.

The present invention relates to resistance elements, featured by being provided in both electrodes of the oxides and being used as resistance.

The present invention relates to a resistance element, wherein two kinds of layers different in electron carrier concentration and conductivity of the oxide semiconductor are used and the first layer of the oxide is in contact with an electrode through the second layer of the oxide.

Here, it is preferable that configuration proportion of In:Ga:Zn of the element is 1:1:m (m being a natural number less than 6). In addition, electric conductivity depends on intended use, and for example, electric conductivity is not more than 10 S/cm. The lower limit value is for example 0.01 S/cm.

Here, the above description stipulates electric conductivity, which however can be appropriately set corresponding with intended use.

That is, the present invention is a semiconductor device, wherein amorphous oxides with electron carrier concentration at the room temperature less than $1\times10^{18}/cm^3$ are used as electron conductive material. Further in addition, another type of the present invention is a semiconductor device, wherein amorphous oxides featured by electron mobility to increase as electron carrier concentration increases are used as electron conductive material.

In addition, the present invention covers the following circuits.

The present invention relates to an integrated circuit, comprising at least In, Ga, Zn and O as constituent elements and comprising as a component a circuit including N-type TFT (N-TFT) with use of transparent amorphous oxide thin film with electron carrier concentration less than $1\times10^{18}/cm^3$ as an N-type semiconductor.

In addition, the present invention relates to logic circuits such as an inverter, a NOR, a NAND, a flip-flop, a shift register and the like, wherein an N-type TFT (N-TFT) with use of the transparent oxide semiconductor film as an N-type semiconductor is included.

In addition, the present invention relates to memory circuits such as SRAM (Static Random Access Memory), ROM (Read Only Memory) and the like, wherein an N-type TFT (N-TFT) with use of the transparent oxide semiconductor film as an N-type semiconductor is included.

In addition, the present invention relates to an analogue circuit such as a differential amplifier, wherein an N-type TFT (N-TFT) with use of the transparent oxide semiconductor film as an N-type semiconductor is included.

In addition, the present invention relates to an ID tag or an IC tag, wherein a circuit including an N-type TFT (N-TFT) with use of the transparent oxide semiconductor film as an N-type semiconductor is a component.

In addition, the present invention relates to an active matrix substrate, comprising as a switching element an N-type TFT (N-TFT) with use of the transparent oxide semiconductor film as an N-type semiconductor.

Here, it is preferable that configuration proportion of In:Ga:Zn of the element is 1:1:m (m being a natural number less than 6). In addition, electric conductivity depends on intended use, and for example, electric conductivity is not more than 10 S/cm. The lower limit value is for example 0.01 S/cm.

Here, the above description stipulates electric conductivity, which however can be appropriately set corresponding with intended use.

In addition, an electronic circuit related to the present invention is featured by comprising as a switching element an N-type TFT (N-TFT) with use of transparent amorphous oxide film with electron carrier concentration less than $1\times10^{18}/cm^3$ as an N-type semiconductor.

In addition, an electronic circuit related to the present invention is featured by comprising as a switching element an N-type TFT (N-TFT) with use of transparent amorphous oxide film featured by electron mobility to increase as electron carrier concentration increases as an N-type semiconductor.

According to the present invention, provision etc. of semiconductor devices (SIT, SBT, PN-T, SBD, PN-D, resistance and the like) utilizing amorphous oxides with electron carrier concentration less than $1\times10^{18}/cm^3$ will become feasible.

DETAILED DESCRIPTION OF THE INVENTION

Figure 1:
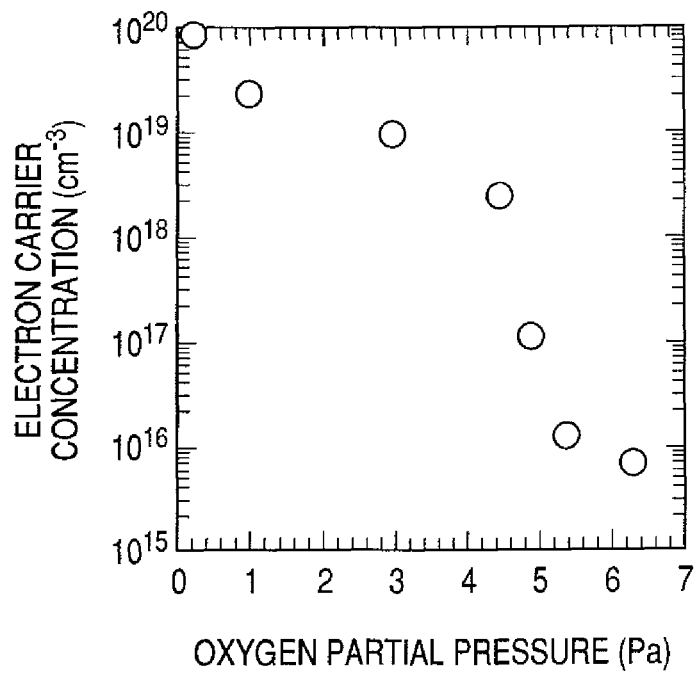
FIG. 1 is a graph showing a relationship between electron carrier concentration of In—Ga—Zn—O system amorphous film having undergone film deposition with pulsed laser deposition and partial pressure of oxygen during film formation.

Firstly, a semiconductor device related to the present invention as a first embodiment and an integrated circuit as a second embodiment will be described, and thereafter, amorphous oxides used in the present invention will be described in detail.

(First Embodiment: Semiconductor Device)

Firstly, a semiconductor device having a P-type region and an N-type region will be described. Here, the semiconductor device of concern contains PN-junction transistors and heterojunction devices. The present invention is featured by use as amorphous oxides configuring an N-type region of oxides with electron carrier concentration less than $1 \times 10^{18}/cm^3$ or oxides, or oxides showing tendency of increase in electron mobility as electron carrier concentration increases. These amorphous oxides will be described later. Here, on a substrate, either provision of the N-type region inside the P-type region or provision of the P-type region inside the N-type region is also a preferable mode. In addition, forming of the P-type region and the N-type region in the same layer on a substrate is also a preferable mode. In addition, configuration of the P-type region and the N-type region made from different amorphous oxides materials is also a preferable mode. Moreover, the present invention relates to an SIT element using the transparent oxide semiconductor film as an N-type semiconductor. An example will be described with reference to FIG. 7. In particular, an electrode 11-1 is formed on an insulating substrate 10 made of such as glass and plastic etc. with ITO that can form ohmic contact with the transparent oxide semiconductor, and subsequently the transparent oxide semiconductor film 13 is formed on the electrode. Moreover, a plurality of electrodes 12 are formed with material, such as Pt, having a work function larger than the absolute value of the Fermi level of the semiconductor film, and moreover, the oxide film is laminated. Thereafter, forming an electrode 11-2 with the same materials as the electrode 11-1, an SIT element can be made. Accordingly, such an effect that an element having current capability higher than a TFT using the transparent oxide semiconductor film is derived.

In addition, making Pt of the electrode 12 thin, or using a P-type transparent oxide semiconductor film with the absolute value of Fermi level being larger than the absolute value of Fermi level of the semiconductor film, a transparent SIT element can be made.

The present invention relates to an SBT element using the transparent oxide semiconductor film as an N-type semiconductor.

In particular, the transparent oxide N-type semiconductor film 1 is formed onto an insulating substrate made of such as glass and plastic etc. Subsequently, electrodes 11-1 and 11-2 are formed on the oxide film with ITO that can form ohmic contact and, a gate electrode 12 is formed therebetween with material, for example Pt, that has work function larger than the absolute value of the Fermi level of the semiconductor film, and thereby an SBT element can be made. Accordingly, such an effect that a transistor element with the current between electrodes 11-1 and 11-2 being controllable with the voltage applied to the gate electrode in a configuration simpler than a TFT using the transparent oxide semiconductor film is derived. Particularly, making the oxide film under the electrode 11-2 thin, the amount of current that can undergo modulation with the gate voltage will get larger.

In addition, making Pt of the electrode 12 thin, a transparent SBT element can be made.

The present invention relates to a PN-T element using the transparent oxide semiconductor film as an N-type semiconductor.

Figure 12:
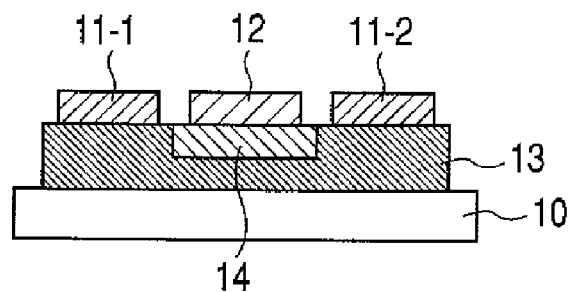
FIG. 12 is a diagram showing an Example of a PN-T element.

In particular, as shown in FIG. 12, the transparent oxide N-type semiconductor film 13 is formed on an insulating substrate 10 made of such as glass and plastic etc. Subsequently, forming electrodes 11-1 and 11-2 on the oxide film with ITO that can form ohmic contact; laminating, therebetween, P-type semiconductor material 14 having the absolute value of the Fermi level larger than the absolute value of the Fermi level of the semiconductor film; and forming the gate electrode. 12 on the P-type semiconductor material with material, for example Pt, that can form ohmic contact with the P-type semiconductor material, a PN-T element can be made. Accordingly, such an effect that a transistor element with the current between electrodes 11-1 and 11-2 being controllable with the voltage applied to the gate electrode in a configuration simpler than a TFT using the transparent oxide semiconductor film is derived. Particularly, making the oxide film under the electrode 11-2 thin, the amount of current that can undergo modulation with the gate voltage will get larger.

In addition, making Pt of the electrode 12 thin and using a transparent oxide P-type semiconductor for the P-type semiconductor, a transparent PN-T element can be made.

The present invention relates to a BPT element using the transparent oxide semiconductor film as an N-type semiconductor.

In particular, the transparent oxide N-type semiconductor film 1, semiconductor film 1' being the transparent oxide N-type semiconductor with different carrier concentration and conductivity and P-type semiconductor film with the absolute value of the Fermi level being larger than the absolute value of the Fermi level of the semiconductor film are formed onto an insulating substrate made of such as glass and plastic etc. Subsequently, forming electrodes 1-1 and 1-2 on the oxide film 1 and 1' with ITO that can form ohmic contact and forming the base electrode 2 on the P-type semiconductor film with material, for example Pt, that can form ohmic contact, a BPT element can be made.

In addition, making Pt of the electrode 2 thin and using a transparent oxide P-type semiconductor for the P-type semiconductor, a transparent BPT element can be made.

The present invention relates to a SBD element using the transparent oxide semiconductor film as an N-type semiconductor.

In particular, the transparent oxide N-type semiconductor film 1 is formed on an insulating substrate made of such as glass and plastic etc. Subsequently, an electrode 1 is formed on the oxide film with ITO that can form ohmic contact, and an electrode 2 is formed with material, for example Pt, that has work function larger than the absolute value of the Fermi level of the semiconductor film, and thereby an SBD element can be made.

In addition, making Pt of the electrode 2 thin, a transparent SBD element can be made.

Figure 14:
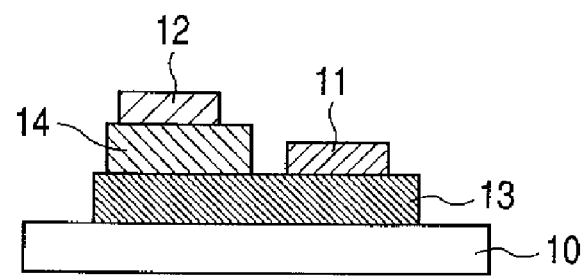
FIG. 14 is a diagram showing an Example of a PN-D element.

The present invention relates to a PN-D element using the transparent oxide semiconductor film as an N-type semiconductor (in FIG. 14).

In particular, the transparent oxide N-type semiconductor film 13 is formed on an insulating substrate 10 made of such as glass and plastic etc. Subsequently, forming an electrode 11 on the oxide film with ITO that can form ohmic contact; laminating, therebetween, P-type semiconductor material 14 having the absolute value of the Fermi level larger than the absolute value of the Fermi level of the semiconductor film; and moreover, forming an electrode 12 with material, for example Pt, that can form ohmic contact with the P-type semiconductor, a PN-D element can be made.

In addition, using a transparent oxide P-type semiconductor as the P-type semiconductor material and making Pt of the electrode 2 thin, a transparent PN-D element can be made.

The present invention relates to a resistant element using the transparent oxide semiconductor film as a resistant material.

In particular, the transparent oxide N-type semiconductor film 1 is formed on an insulating substrate made of such as glass and plastic etc. Subsequently, forming electrodes 11-1 and 11-2 on the oxide film with ITO that can form ohmic contact, a transparent resistance element can be made.

Between the semiconductor film 1 and the electrodes 11-1 and 11-2, the transparent oxide N-type semiconductor film with carrier concentration and conductivity being different from those of the semiconductor film 1 may be provided. Here, all the oxide layers do not have to be with carrier concentration of less than $1 \times 10^{18}/cm^3$ and conductivity of not more than 10 S/cm.

Metals and alloys etc. of such as the ITO or calcium (Ca) etc. featured by work function being comparable with or slightly smaller than the absolute value of the Fermi level of the semiconductor film can be nominated as materials to form ohmic contact with the transparent oxide N-type semiconductor.

Highly electrically conductive material used as electrodes of forming gate electrodes of the SIT and SBT as well as an electrode of forming a Schottky barrier of the SD, which have the large work function include metals selected from the group consisting of platinum (Pt), Ni and gold (Au) etc., for example.

Moreover, forming the metals to be extremely thin, transparent or translucent metal film, and in combination with the oxides, transparent SIT, SBT as well as SD can be made.

The SIT, a P-type semiconductor for a gate electrode of a PN-T as well as a P-type semiconductor of the PN-D may include, for use, inorganic semiconductors selected from the group of consisting of Si with an acceptor being doped, etc., low molecule organic semiconductors such as pentacene, etc., polymeric organic semiconductors such as polythiophene and polyphenylene vinylene, etc. and oxide semiconductors such as $Cu_2O$, etc. However, in order to form a PN junction barrier, the absolute value of Fermi level of the P-type semiconductor shall have a value larger than the absolute value of Fermi level of the oxide N-type semiconductor.

Moreover, using the oxide P-type semiconductor and transparent electrodes made of ITO, etc., transparent SIT, PN-T as well as PN-D can be made.

In addition, many of semiconductor materials such as the Si etc. are different in band gap from amorphous transparent oxides with electron carrier concentration less than $1\times10^{18}/cm^3$ and amorphous transparent oxides showing tendency of increase in electron mobility as electron carrier concentration increases. Consequently, a heterojunction with the region consisting of this amorphous transparent oxides semiconductor is formed. In this way, a semiconductor device having a heterojunction is configured.

(Second Embodiment: Integrated Circuit)

In addition, the present invention relates to a logic circuit with TFT including the transparent being semiconductor film, used as N-TFT.

In particular, N-TFT with use of a resistance with the transparent film being electronic conductor and the transparent film is connected in series between the power supply and the ground potential (GND) taking the gate of the N-TFT as signal input and the source of the TFT as output.

Thereby, an inverter circuit using the transparent film as a semiconductor layer can be configured.

Moreover, using P-type TFT (hereinafter to be referred to as P-TFT) with use of P-type semiconductor as an active layer instead of the resistance, and taking the gate of P-TFT as the input common with the gate of N-TFT, a complementary TFT circuit can be configured.

This derives an effect that the pass-through current at the time of operation of an inverter is restrained to enable configuration of a circuit with low power consumption.

Materials of the P-type semiconductor preferably include, for use, inorganic semiconductors such as doped Si etc., low molecule organic semiconductors such as pentacene, etc., polymeric organic semiconductors such as polythiophene and polyphenylene vinylene, etc. and oxide semiconductors such as $Cu_2O$, etc. Particularly, in case of using the oxide semiconductor as P-type semiconductor, a circuit with semiconductor layer being transparent can be configured.

Likewise the inverter circuit, logic circuits selected from the group of consisting of a clocked inverter circuit, a NAND circuit, a NOR circuit, a flip-flop and a shift register, etc. can be configured.

In addition, the present invention relates to an SRAM circuit with TFT including the transparent being semiconductor film, used as N-TFT.

In particular, with regard to an inverter circuit comprising two units of N-TFT with use of the transparent film, input and output are brought into connection, each N-TFT is provided between respective inputs of the inverter and two bit lines (BL and barred BL) and each gate of the N-TFT are respectively connected to a word line (WL). Thereby, a 1-bit SRAM cell circuit using the transparent film as an N-type semiconductor layer can be configured.

Moreover, in case of using an inverter configured by the N-TFT and the transparent film as a resistance, SRAM with at least TFT and resistance being transparent can be made.

In addition, the present invention relates to a ROM circuit with TFT including the transparent being semiconductor film, used as N-TFT.

In particular, the circuit comprises a plurality of word lines (WL1 to WLn) and a plurality of bit lines (BL1 to BLn), and the bit lines are respectively provided with a plurality of N-TFTs with the transparent film being semiconductor film to the gate of which the word lines are connected, the source of which are connected to the GND and the drain of which is connected in parallel. However, without comprising N-TFT corresponding to all the word lines for a bit line, N-TFTs corresponding to several word lines are omitted. Thereby, a NOR-type ROM circuit using the transparent film as an N-type semiconductor layer can be configured.

Moreover, using the transparent film, the TFT part of the ROM circuit can be made transparent.

In addition, the present invention relates to a differential amplifier circuit with a TFT including the transparent being semiconductor film, used as an N-TFT.

In particular, a differential amplifier circuit is configured by comprising an N-TFT with a source being grounded to GND and a gate to which a constant voltage is applied as bias voltage, two N-TFTs with the gate as input and the sources thereof connected to the drain of the N-TFT and a resistance between each dram of the two N-TFT and an electric supply and by taking the point between the drain of the N-TFT and resistance as output.

Moreover, using the transparent film as the resistance, at least the N-TFT and the resistance portions can be made transparent.

In addition, the present invention relates to an IC tag or an ID tag configured by a circuit with a TFT including the transparent film being a semiconductor, used as N-TFT.

In particular, the IC tag or ID tag is configured by including all or at least any of analogue circuit using the logic circuit, the memory circuit and the differential amplifier circuit and a rectifier circuit with use of an element realizing features of a diode by making the gate and the drain of the N-TFT short-circuit.

Use of the transparent film for the ID tag can make at least the N-TFT and resistance portion transparent.

In addition, the present invention relates to an active matrix substrate with use of, as an N-TFT, a TFT with the transparent film being a semiconductor.

In particular, an active matrix substrate selected from the group consisting of an LCD (Liquid Crystal Display), an organic EL (Electro-Luminescence) display and an optical sensor etc. with use of the N-TFT as switching elements for respective cell circuits can be made.

Using an N-TFT with the transparent film being a semiconductor for the active matrix substrate, such an effect that aperture ratio can be made to increase is derived.

Additionally, as to the above mentioned circuits, all elements do not always need to be constituted by TFT. The circuits can be constituted by using arbitrarily PN transistor, SIT, SB-T and BP-T.

(As Concerns Another Amorphous Oxides)

Electron carrier concentration of amorphous oxides related to the present invention is a value in case of measurement at a room temperature. The room temperature refers to, for example, 25° C. and, in particular, a temperature appropriately selected from 0° C. to around 40° C. Here, electron carrier concentration of amorphous oxides related to the present invention does not have to fulfill a condition less than $1\times10^{18}/cm^3$ over the entire range of 0° C. to 40° C. And it is advisable that, for example, electron carrier concentration less than $1\times10^{18}/cm^3$ is realized at 25° C. In addition, lowering electron carrier concentration further to reach not more than $1\times10^{17}/cm^3$ and more preferably not more than $1\times10^{16}/cm^3$, TFT that is normally turned OFF, is derived well with the good yield factors.

Additionally, the "less than $10^{18}/cm^3$" means preferably less than $1\times10^{18}/cm^3$, and more preferably less than $1.0\times10^{18}/cm^3$.

Measurement of electron carrier concentration can be derived by Hall effect measurement.

Here, in the present invention, an amorphous oxide refers to an oxide on which halo pattern is observed in the X-ray diffraction spectrum and which shows no particular diffraction line.

The lower limit value of electron carrier concentration in the amorphous oxides of the present invention will not be limited in particular if applicable as a channel layer of TFT. The lower limit value is, for example, $1\times10^{12}/cm^3$.

Accordingly, in the present invention, controlling materials, composition proportions, manufacturing conditions, etc. of the amorphous oxides as later described respective Examples, for example, electron carrier concentration is set not less than $1\times10^{12}/cm^3$ and less than $1\times10^{18}/cm^3$. Setting to the range of not less than $1\times10^{13}/cm^3$ and not more than $1\times10^{17}/cm^3$ is more preferable, and setting to not less than $1\times10^{15}/cm^3$ and not more than $1\times10^{16}/cm^3$ is further more preferable.

Besides InZnGa oxides, the amorphous oxides can also be appropriately selected from In oxides, $In_xZn_{1-x}$ oxides ($0.2\leq x\leq 1$), $In_xSn_{1-x}$ oxides ($0.8\leq x\leq 1$) or $In_x(Zn, Sn)_{1-x}$ oxides ($0.15\leq x\leq 1$).

Here, $In_x(Zn, Sn)_{1-x}$ oxides can be described as $In_x(Zn_ySn_{1-y})_{1-x}$ oxides and the range of y is from 1 to 0.

Here, in case of In oxides without including Zn and Sn, a part of In can also be replaced with Ga. That is, it is a case of $In_xGa_{1-x}$ oxides ($0\leq x\leq 1$).

Amorphous oxides with electron carrier concentration of less than $1\times10^{18}/cm^3$ that the present inventor has succeeded in making will be described below in detail.

The oxides are configured by containing In—Ga—Zn—O and are featured by composition in a state of crystal being expressed by $InGaO_3(ZnO)_m$ (m is a natural number of less than 6) and by electron carrier concentration being less than $1\times10^{18}/cm^3$.

In addition, the oxides are configured by containing In—Ga—Zn—Mg—O and are featured by composition in a state of crystal being expressed by $InGaO_3(Zn_{1-x}Mg_xO)_m$ (m is a natural number of less than 6, $0<x\leq 1$) and by electron carrier concentration being less than $1\times10^{18}/cm^3$.

Here, a film configured by these oxides is also preferably designed so as to derive electron carrier concentration in excess of 1 $cm^2/(V\cdot second)$.

The case of use of the film for a channel layer can realize the transistor characteristics of being in normally OFF with the gate current less than 0.1 micro-ampere at the time of transistor being turned OFF and ON•OFF proportion being in excess of $10^3$. In addition, a flexible TFT that is transparent or has translucency to visible light is realized.

Here, the film is featured in that electron mobility increases as the number of conduction electrons increases. As a substrate of forming the transparent film, a glass substrate, a plastic substrate made of resins or plastic film etc. can be used.

At the time when the amorphous oxide film is utilized for a channel layer, one kind among $Al_2O_3$, $Y_2O_3$ or $HfO_2$, or a mixed crystal compound containing at least not less than two kinds of those compounds can be utilized for the gate insulating film.

In addition, film deposition in an atmosphere including oxygen gas without intentionally adding impurity ions in amorphous oxides for intensifying electric resistance is also a preferable mode.

The present inventors has found out that this semi-insulating oxide amorphous thin film increases in electron mobility as the number of conduction electrons increases. And, using that film, a TFT was made to have given rise to further improvement in transistor features such as ON•OFF proportion, saturation current in a pinch off state and switching speed etc. That is, a TFT of a normally OFF type was found out to be realizable in utilization of amorphous oxides.

Use of amorphous oxides as a channel layer of a film transistor enables electron mobility to reach in excess of 1 $cm^2/(V\cdot second)$ and preferably 5 $cm^2/(V\cdot second)$. When electron carrier concentration is less than $1\times10^{18}/cm^3$ and preferably less than $1\times10^{16}/cm^3$, current between the drain and source terminals at the time of OFF (at the time of no gate voltage application) can be made to be less than 10 micro-ampere and preferably less than 0.1 micro-ampere. In addition, use of the film can make saturation current after pinch-off to be in excess of 10 micro-ampere and ON•OFF proportion to be in excess of $10^3$ at the time of electron mobility being in excess of 1 $cm^2/(V\cdot second)$, preferably 5 $cm^2/(V\cdot second)$.

In a TFT, high voltage is applied to the gate terminal in a pinched-off state and highly dense electrons are present in the channel. Therefore according to the present invention, the saturation current value can be made larger by the portion of increase in electron mobility. As a result hereof, improvement in transistor features such as increase in ON•OFF proportion, increase in saturation current and increase in switching speed etc. can be expected. Here, inside normal compounds, when the number of electrons increases, electron mobility decreases due to collision between electrons.

Here, as a structure of the TFT, a staggered (top gate) structure of forming a gate insulating film and a gate terminal sequentially on a semiconductor channel layer and an inverted staggered (bottom gate) structure of forming a gate insulating film and a semiconductor channel sequentially on a gate terminal can be used.

(First Film Deposition Method: PLD Method)

Amorphous oxide thin film, composition of which is expressed with $InGaO_3(ZnO)_m$ (m being a natural number of less than 6) in a crystal state is held stable on the amorphous state up to a high temperature of not less than 800° C. in case of the value m being less than 6, but is apt to get crystallized as the value m increases, that is, as the proportion of ZnO to $InGaO_3$ increases to approach the ZnO composition.

Accordingly, as the channel layer of an amorphous TFT, the value m is preferably less than 6.

It is advisable that the method of forming film employs vapor deposition targeting a polycrystalline sintered compact having $InGaO_3(ZnO)_m$ composition. Among vapor deposition methods, a sputtering method and pulsed laser deposition are appropriate. Moreover, from the point of view of mass production, the sputtering method is most appropriate.

However, making of the amorphous film under normal conditions gave rise mainly to oxygen deficiency, and so far failed in deriving electron carrier concentration of less than $1\times10^{18}/cm^3$ and not more than 10 S/cm in terms of electrical conductivity. In case of using such a film, a transistor of normally OFF cannot be configured.

Figure 9:
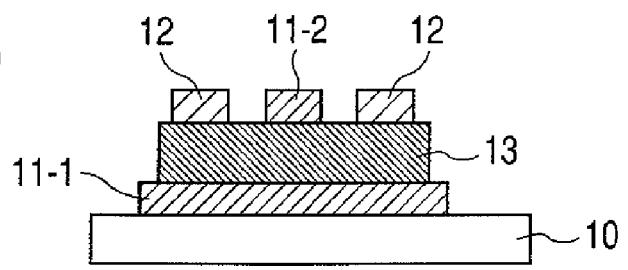
FIG. 9 is a diagram showing Example 3 of an SIT element.

The present inventor made In—Ga—Zn—O that was made with Pulsed Laser Deposition with the apparatus shown in FIG. 9.

Figure 48:
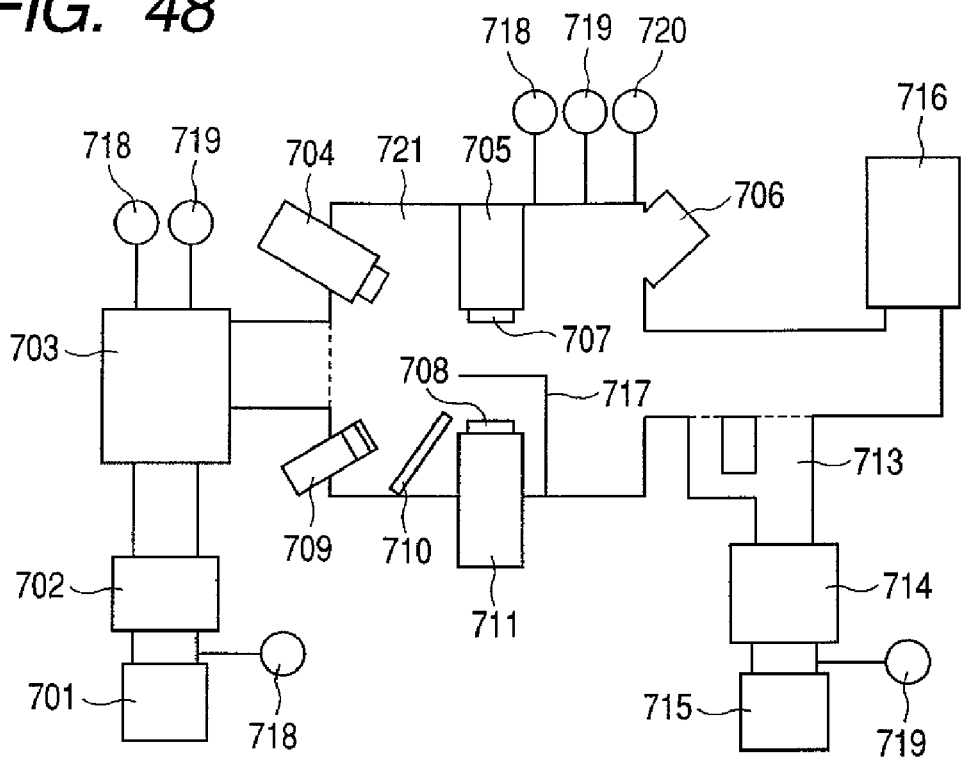
FIG. 48 is a schematic diagram of an apparatus used at the time of implementing the PLD.

Using the PLD film deposition apparatus as shown in FIG. 48, film deposition was implemented. In the drawing, reference numeral 701 denotes an RP (rotary pump), 702 a TMP (turbo molecule pump), 703 a preparation room, 704 an electron gun for RHEED, 705 substrate holding means for rotating and elevating a substrate up and down, 706 a laser incident window, 707 a substrate, 708 a target, 709 a radical source and 710 a gas introducing port. Reference numeral 711 denotes target holding means in order for a target to rotate and elevate up and down, 712 a bypass line, 713 a main line, 714 a TMP (turbo molecule pump), 715 and RP (rotary pump), 716 a titan getter pump, 717 a shutter. In addition, Reference numeral 718 in the drawing denotes an IG (ion vacuum gauge), 719 a PG (Pirani vacuum gauge), 720 a BG (Baratron vacuum gauge) and 721 a growth room (chamber).

With Pulsed Laser Deposition with use of KrF excimer laser, In—Ga—Zn—O system amorphous oxides semiconductor thin film was brought into deposition on an $SiO_2$ glass substrate (product No. 1737 produced by Corning incorporated). As treatment prior to deposition, a substrate underwent ultrasonic degreasing cleaning with acetone, ethanol and ultrapure water for 5 minutes each, and thereafter was dried at 100° C. in the atmosphere.

For the polycrystalline target, an $InGaO_3(ZnO)_4$ sintered compact target (with sizes of 20 mm$\phi$ 5 mmt) was used. This is to be derived subject to wet blending of $In_2O_3$:$Ga_2O_3$:ZnO (respectively 4N reagent) (solvent: ethanol) as a staring material and thereafter via temporary sintering (1000° C.: 2 h), dry ground and main sintering (1550° C.: 2 h). Electrical conductivity of thus made target was 90 (S/cm).

Setting the base vacuum pressure of the growth room to $2\times10^{-6}$ (Pa), oxygen partial pressure during growth was controlled to 6.5 (Pa) to implement film deposition.

Oxygen partial pressure inside the chamber 721 is 6.5 Pa and the substrate temperature is 25° C. Here, distance between the target 708 and the substrate 707 to undergo film deposition is 30 (mm) and the power of incident KrF excimer laser from the incident window 716 is in the range of 1.5 to 3 (mJ/$cm^2$/pulse). In addition, the pulse width was set to 20 (nsec), repetition frequency to 10 (Hz) and irradiation spot diameter to 1×1 (mm angle). Thus, film deposition was implemented at a film deposition rate of 7 (nm/min). Derived thin film underwent small angle X-ray scattering method (SAXS) of thin film (thin film method, at incident angle of 0.5 degree), clear diffraction peak was not admitted, and therefore the made In—Ga—Zn—O system thin film can be regarded to be amorphous.

Moreover, as a result of X ray reflection ratio measurement and pattern analyses, root-mean-square roughness (Rrms) of thin film was found to be approximately 0.5 nm and film thickness to be approximately 120 nm. As a result of X-ray fluorescence (XRF) analyses, metal composition proportion of thin film was In:Ga:Zn=0.98:1.02:4.

Electrical conductivity was less than approximately $10^{-2}$ S/cm. Electron carrier concentration is estimated to be not more than approximately $1\times10^{16}$/$cm^3$ and electron mobility to be approximately 5 $cm^2$/(V·second).

From analyses on the optical absorption spectrum, the energy range in optical bandgap of the made amorphous thin film was derived to be approximately 3 eV. From the foregoing, the made In—Ga—Zn—O system thin film was found to present amorphous phase close to crystalline $InGaO_3(ZnO)_4$ composition and to be transparent flat thin film with little oxygen deficiency and with small electrical conductivity.

Description will be made with reference to FIG. 1 in particular. The drawing is to show variation in electron carrier concentration of oxides having undergone film deposition in case of making oxygen partial pressure to change in case of forming transparent amorphous oxide thin film configured by In—Ga—Zn—O and expressed by $InGaO_3(ZnO)_m$ (m being a number less than 6) for composition at the time of assumption of crystalline state under the same condition as those of the present embodiment.

Film deposition under the same conditions as those of the present embodiment in an atmosphere with high oxygen partial pressure in excess of 4.5 Pa enabled electron carrier concentration to drop to less than $1\times10^{18}$/$cm^3$ as shown in FIG. 1. In this case, the substrate temperature is maintained approximately at the room temperature in a state of not intentionally increasing temperature. In order to use flexible plastic film as a substrate, the substrate temperature is preferably maintained at less than 100° C.

Further increase in oxygen partial pressure enables electron carrier concentration to drop further. For example, as shown in FIG. 1, in case of $InGaO_3(ZnO)_4$ thin film having undergone film deposition at the substrate temperature of 25° C. and oxygen partial pressure of 5 Pa, the number of electron carriers was successfully made to drop to $1\times10^{16}$/$cm^3$.

Figure 2:
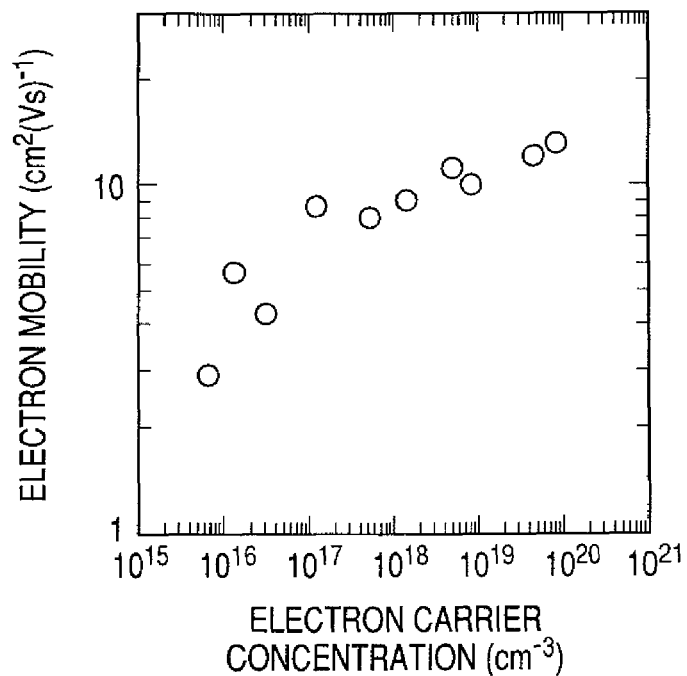
FIG. 2 is a graph showing a relationship between the electron carrier number and electron mobility of In—Ga—Zn—O system amorphous film having undergone film deposition with pulsed laser deposition.

The derived thin film had electron mobility in excess of 1 $cm^2$/(V·second) as shown in FIG. 2. However, in pulsed laser deposition method of the present embodiment, oxygen partial pressure of not less than 6.5 Pa will make the surface of the deposited film into a relief state and will become difficult for use as a channel layer of a TFT.

Accordingly, using transparent amorphous oxide thin film expressed by composition of $InGaO_3(ZnO)_m$ is a number less than 6) in a crystalline state with Pulsed Laser Deposition under an atmosphere with oxygen partial pressure in excess of 4.5 Pa, preferably, in excess of 5 Pa, and less than 6.5 Pa, a transistor that is normally turned OFF can be configured.

In addition, for electron mobility of the thin film, an excess of 1 $cm^2$/V·second was derived, enabling ON•OFF proportion to get large in excess of $10^3$.

As having been described so far, in case of film deposition of InGaZn oxides with PLD method under conditions shown in the present embodiment, the oxygen partial pressure is desired to be controlled to reach not less than 4.5 Pa and less than 6.5 Pa.

Here, realization of electron carrier concentration less than $1\times10^{18}$/$cm^3$ is dependent on oxygen partial pressure condition, configuration of film deposition apparatus, materials and composition to undergo film deposition and the like.

Figure 5:
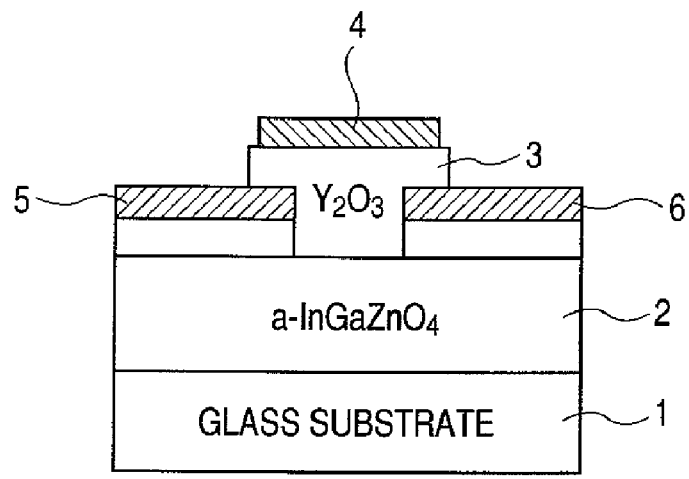
FIG. 5 is a schematic diagram showing a top gate type MISFET element structure made in Example 1.

Next, under the conditions with the oxygen partial pressure of 6.5 Pa in the apparatus, an amorphous oxide was formed and an MISFET element of top gate type shown in FIG. 5 was formed. In particular, at first, with the method of forming the amorphous In—Ga—Zn—O thin film on the glass substrate (1), semi-insulating amorphous $InGaO_3(ZnO)_4$ film with thickness of 120 nm for use as a channel layer (2) was formed.

Moreover thereon, setting the oxygen partial pressure inside the chamber to less than 1 Pa, laminating 30 nm respectively of $InGaO_3(ZnO)_4$ having large electrical conductivity and gold film with Pulsed Laser Deposition, a drain terminal (5) and a source terminal (6) were formed with a photolithography method and a liftoff method.

Figure 6:
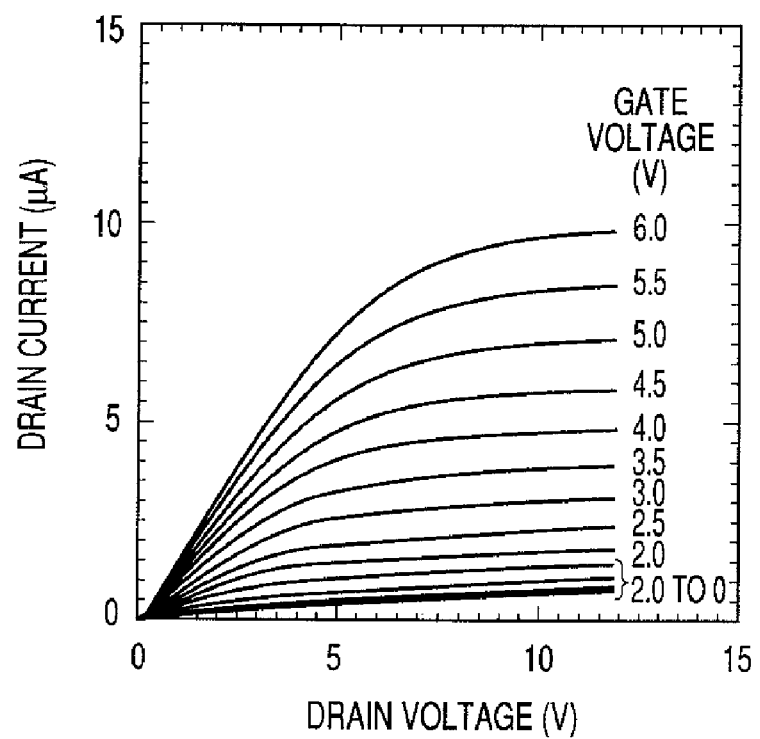
FIG. 6 is a graph showing current-voltage characteristics of a top gate type MISFET element made in Example 1.

Lastly, bringing $Y_2O_3$ film to be used as gate insulating film (3) into film deposition with electron beam deposition (thickness: 90 nm, relative permittivity: approximately 15, leak current concentration: $10^{-3}$ A/$cm^2$ at the time of applying 0.5 MV/cm), and bringing gold into film deposition thereon, a gate terminal (4) was formed with a photolithography method and a liftoff method. Assessment on features of MISFET element FIG. 6 shows current-voltage features of an MISFET element measured under the room temperature.

It is found that the channel is an n-type semiconductor since the drain current $I_{DS}$ increased as the drain voltage $V_{DS}$ increased. This does not contradict the fact that the amorphous In—Ga—Zn—O system semiconductor is an n-type. $I_{DS}$ showed a typical behavior of semiconductor transistor that is saturated (pinched off) around $V_{DS}$=6V. Examination on gain features derived the threshold value of the gate voltage $V_{GS}$ of approximately −0.5V at the time of applying $V_{DS}$=4V. In addition, at the time of $V_{GS}$=10V, the current of $I_{DS}=1.0\times10^{-5}$ A flowed. This corresponds with successful induction of carriers inside In—Ga—Zn—O system amorphous semiconductor thin film of an insulator with gate bias.

ON•OFF proportion of the transistor was in excess of $10^3$. In addition, calculation of field effect mobility from output features derived field effect mobility of approximately 7 cm$^2$ (Vs)$^{-1}$ in the saturated region. Likewise measurement was implemented on the made element with irradiation of visible light, but no change in the transistor features was admitted.

According to the present embodiment, thin film transparent having high electric resistance as well as a channel layer with large electron mobility can be realized.

Here, the above described amorphous oxides were provided with excellent features that electron mobility increased as electron carrier concentration increased and moreover degenerate conduction was shown. In the present embodiment, a thin film transistor was made on the glass substrate, but film deposition itself can be implemented at the room temperature, a substrate such a plastic plate or film is usable. In addition, the amorphous oxides derived in the present embodiment have little optical absorption on visible light and can realize a transparent and flexible TFT.

(Second Film Deposition Method: Sputtering Method (SP Method))

A case of film deposition with a high frequency SP method with use of argon gas as atmosphere gas will be described.

Figure 49:
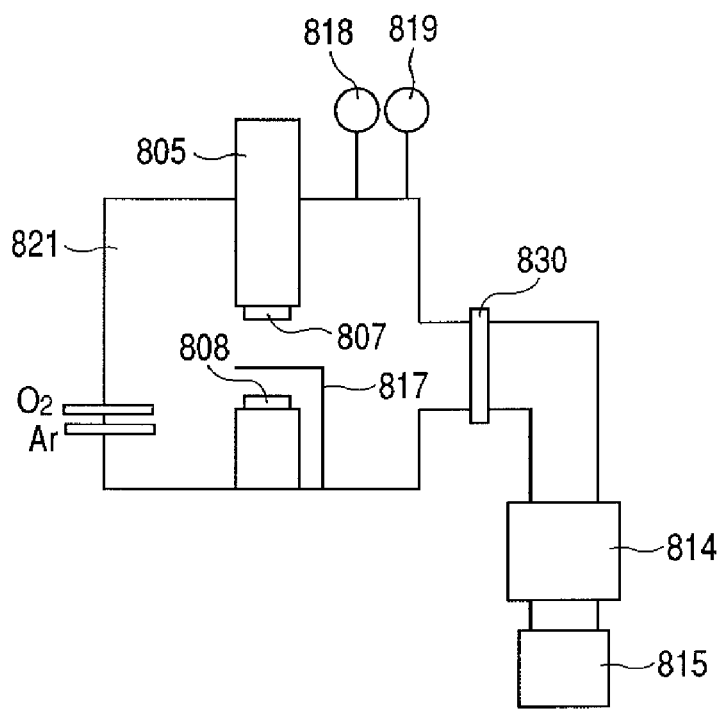
FIG. 49 is a schematic diagram of an apparatus used at the time of implementing the PLD.

The SP method was implemented with an apparatus shown in FIG. 49. In the drawing, reference numeral 807 denotes a substrate to undergo film deposition, 808 a target, 805 substrate holding means with cooling mechanism, 814 a turbo molecule pump, 815 a rotary pump, 817 a shutter, 818 an ion vacuum gauge, 879 a Pirani vacuum gauge, 821 a growth room (chamber) and 830 a gate valve.

As a substrate 807 to undergo film deposition, an SiO$_2$ glass substrate (product No. 1737 produced by Corning incorporated) was prepared. As treatment prior to film deposition, this substrate underwent ultrasonic degreasing cleaning with acetone, ethanol and ultrapure water for 5 minutes each, and thereafter was dried at 100° C. in the atmosphere.

As the target material, a polycrystalline sintered compact (size 20 mmφ 5 mmt) having InGaO$_3$(ZnO)$_4$ composition was used.

This sintered compact was made subject to wet blending of In$_2$O$_3$:Ga$_2$O$_3$:ZnO (respectively 4N reagent) (solvent: ethanol) as a starting material and via temporary sintering (1000° C.: 2 h), dry ground and main sintering (1550° C.: 2 h). Electrical conductivity of this target 808 was 90 (S/cm) and was in a state of semi-insulator.

The base vacuum pressure inside the growth room 821 was $1\times10^{-4}$ (Pa) and the total pressure of oxygen gas and argon gas during growth was set to a constant value within a range of 4 to $0.1\times10^{-1}$ (Pa). And, changing partial pressure proportion of argon gas to oxygen, the oxygen partial pressure was caused to vary within the range of $10^{-3}$ to $2\times10^{-1}$ (Pa).

In addition, substrate temperature was set to the room temperature and the distance between the target 808 and the substrate to undergo film deposition 807 was 30 (mm). The introduced power was RF 180 W and operation was implemented with the film deposition rate of 10 (nm/min). Derived film underwent small angle X-ray scattering method (SAXS) of film plane (thin film method, at incident angle of 0.5 degree), clear diffraction peak was not detected, and therefore the made In—Zn—Ga—O system film was shown to be amorphous film.

Moreover, as a result of X ray reflection ratio measurement and pattern analyses, root-mean-square roughness (Rrms) of thin film was found to be approximately 0.5 nm and film thickness to be approximately 120 nm. As a result of X-ray fluorescence (XRF) analyses, metal composition proportion of thin film was In:Ga:Zn=0.98:1.02:4.

Causing oxygen partial pressures of the atmosphere at the time of film deposition to change, electrical conductivity of derived amorphous oxide film was measured. The results thereof are shown in FIG. 3.

Figure 3:
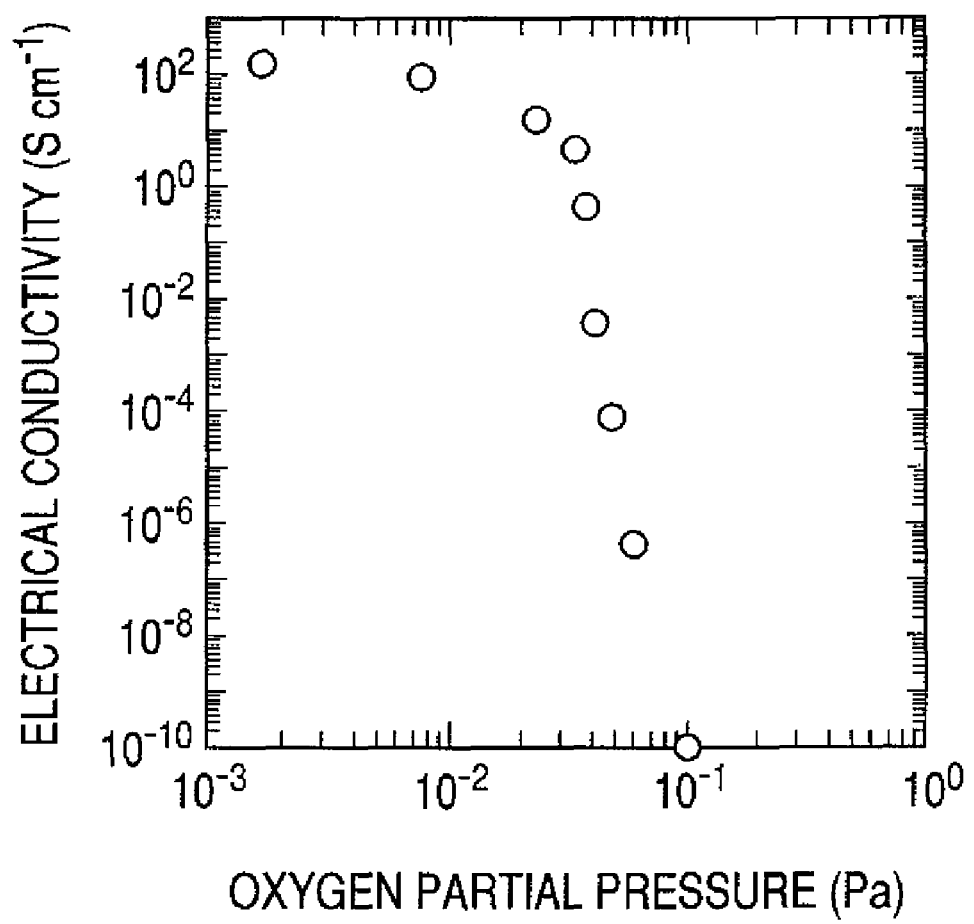
FIG. 3 is a graph showing a relationship between electric conductivity and oxygen partial pressure during film deposition of In—Ga—Zn—O system amorphous.

As shown in FIG. 3, film deposition in an atmosphere with high oxygen partial pressure in excess of $3\times10^{-2}$ Pa enabled electrical conductivity to drop to less than 10 S/cm. Making oxygen partial pressure get further larger, the electron carrier number could be made to drop. For example, as shown in FIG. 3, in case of InGaO$_3$(ZnO)$_4$ thin film having undergone film deposition at the substrate temperature=25° C. with oxygen partial pressure of $10^{-1}$ Pa, electrical conductivity could be made to further drop approximately to $10^{-10}$ S/cm. And, in case of InGaO$_3$(ZnO)$_4$ thin film having undergone film deposition with oxygen partial pressure in excess of $10^{-1}$ Pa, electric resistance was too high to enable measurement of electrical conductivity. In this case, electron mobility could not been measured, but with extrapolation from values for film having large electron carrier concentration, electron mobility was estimated to be approximately 1 cm$^2$/V·second.

That is, using transparent amorphous oxide thin film expressed by composition of InGaO$_3$(ZnO)$_m$ (m is a number less than 6) in a crystalline state with sputtering deposition under an argon gas atmosphere with oxygen partial pressure in excess of $3\times10^{-2}$ Pa, preferably, in excess of $5\times10^{-1}$ Pa, a transistor that is normally turned OFF and with ON•OFF proportion in excess of $10^3$ was successfully configured.

In case of using an apparatus as well as materials shown in the present embodiment, the oxygen partial pressure at the time of film deposition with sputtering is, for example, within the range of not less than $3\times10^{-2}$ Pa and not more than $5\times10^{-1}$ Pa. Here, in thin film made with Pulsed Laser Deposition as well as the sputtering method, as conductive electron number increases, electron mobility increases as shown in FIG. 2.

As described above, controlling oxygen partial pressure, oxygen defects can be reduced, and consequently, electron carrier concentration can be reduced. In addition, since no particle interface is inherently present in an amorphous state unlike in the case of a polycrystalline state, amorphous thin film with high electron mobility can be derived.

Here, also in case of using polyethylene terephthalate (PET) film with thickness of 200 μm instead of the glass substrate, the derived InGaO$_3$(ZnO)$_4$ amorphous oxide film showed likewise features.

Here, using a polycrystalline InGaO$_3$(Zn$_{1-x}$Mg$_x$O)$_m$ (m is a natural number less than 6, $0<x\leq1$) as a target, high resistance amorphous InGaO$_3$(Zn$_{1-x}$Mg$_x$O)$_m$ film can be derived even under oxygen partial pressure less than 1 Pa. For example, in case of using a target subject to replacement of Zn with Mg of 80 at %, electron carrier concentration of film derived with pulsed laser deposition in an atmosphere of oxygen partial pressure of 0.8 Pa can be made to less than $1\times10^{16}$/cm$^3$ (electric resistance value is approximately $10^{-2}$ S/cm). Electron mobility of such film drops compared with no Mg added film, but the level thereof is little, and electron mobility at the room temperature is approximately 5 cm$^2$/(V·second), presenting a value larger in approximately around one digit compared with amorphous silicon. In case of film deposition under the same conditions, electrical conductivity and electron mobility drops together for increase in Mg content, and therefore, Mg content is preferably in excess of 20% and less than 85% (in terms of x, $0.2<x<0.85$).

In thin film transistor with use of the amorphous oxide film, it is preferable to select $Al_2O_3$, $Y_2O_3$ or $HfO_2$ or mixed compound containing at least not less than two of those compounds as a gate insulating film. Presence of any defect on the interface between the gate insulating thin film and the channel layer thin film gives rise to a electron mobility drop and hysteresis in transistor characteristics. In addition, in accordance with types of gate insulating film, leak currents are significantly different. Therefore, it is necessary to select gate insulating film suitable to a channel layer. Use of $Al_2O_3$ film can reduce leak currents. In addition, use of $Y_2O_3$ film can drop hysteresis. Moreover, use of $HfO_2$ film with a high dielectric constant can increase electron mobility. In addition, using film made of a mixed crystal of these compounds, a TFT with few leak currents, little hysteresis and large electron mobility can be formed. In addition, since gate insulating film forming process as well as channel layer forming process can be implemented at the room temperature, any of a staggered structure and an inverted staggered structure can be formed as a TFT structure.

Such formed TFT is a 3-terminal element comprising a gate terminal, a source terminal and a drain terminal, uses semiconductor thin film having undergone film deposition on an insulating substrate made of such as ceramics, glass or plastic etc. as a channel layer where electrons or holes move, and is an active element having a function of controlling current to flow in the channel layer by applying voltage to the gate terminal and of switching current between the source terminal and the drain terminal.

Here, it is important in the present invention that desired electron carrier concentration has already been attained by controlling the amount of oxygen deficiency.

In the description, control of the amount of oxygen (the amount of oxygen deficiency) of amorphous oxide film is implemented in an atmosphere containing a predetermined oxygen concentration at the time of film deposition, but it is also preferable to control (decrease or increase) the amount of oxygen deficiency by causing the oxide film to undergo post-treatment in an atmosphere containing oxygen after film deposition.

In order to effectively control the amount of oxygen deficiency, it is advisable that the operation is implemented at the temperature in an atmosphere containing oxygen being not less than 0° C. and not more than 300° C., preferably not less than 25° C. and not more than 250° C., and further preferably not less than 100° C. and not more than 200° C.

Of course, the operation may be implemented in an atmosphere containing oxygen also at the time of film deposition, and further post-treatment may be implemented in an atmosphere containing oxygen also in post-treatment after film deposition. In addition, if a predetermined electron carrier concentration (less than $1\times10^{18}/cm^3$) can be derived, post-treatment after film deposition may be implemented in an atmosphere containing oxygen without implementing oxygen partial pressure control at the time of film deposition.

Here, the lower limit of electron carrier concentration in the present invention depends on for what kind of element, circuit or apparatus the oxide film to be derived is used, and for example not less than $1\times10^{14}/cm^3$.

(Expansion of Material System)

Moreover, as a result of expanding the material system and proceeding with research, it was found out that amorphous oxide film with small electron carrier concentration and large electron mobility could be made with an amorphous oxide made of an oxide containing at least single element selected from the group of Zn, In and Sn. In addition, this amorphous oxide film was found to have unique features that electron mobility increased as conductive electron number increased. Making a TFT with that film, a normally OFF type TFT excellent in transistor characteristics in terms of ON•OFF proportion, saturation current in a pinched-off state, switch speed and the like can be made.

For the present invention, oxides having following characteristics (a) to (h) can be used.

(a) Amorphous oxides with electron carrier concentration less than $1\times10^{18}/cm^3$ at the room temperature.

(b) Amorphous oxides featured by electron mobility to increase as electron carrier concentration increases. Here, the room temperature refers t temperature from 0° C. to around 40° C. Amorphous refers to compounds with only halo pattern being observed in the X-ray diffraction spectrum and which shows no particular diffraction line. In addition, electron mobility here refers to electron mobility derived by Hall effect measurement.

(c) Amorphous oxides described in the (a) or (b) featured by electron mobility at the room temperature being in excess of 0.1 $cm^2/V\cdot second$.

(d) Amorphous oxides described in any of the (b) to (c) showing degenerate conduction. Here, degenerate conduction refers to a state with heat activating energy in temperature dependency of electric resistance being not more than 30 meV.

(e) Amorphous oxides described in any of the (a) to (d) containing at least one kind of element selected from the group consisting of Zn, In and Sn.

(f) Amorphous oxide film containing, in amorphous oxides described in the (e), at least one kind selected from the group consisting of M2 (M2 being Mg and Ca) in element group 2 smaller than Zn in atomic number, M3 (M3 being B, Al, Ga and Y) in element group 3 smaller than In in atomic number, M4 (M4 being Si, Ge and Zr) in element group 4 smaller than Sn in atomic number, M5 (M5 being V, Nb and Ta) in element group 5, Lu and W.

(g) Amorphous oxide film described in any of (a) to (f) being a simple body of a compound with composition in a crystallized state of $In_{2-x}M3_xO_3(Zn_{1-y}M2_yO)_m$ ($0\leq x\leq 2$, $0\leq y\leq 1$, m being 0 or natural numbers of less than 6) or mixed body of compounds thereof with different m. M3 is Ga for example and M2 is Mg for example.

(h) amorphous oxide film described in the (a) to (g) provided on a glass substrate, a metal substrate, a plastic substrate or plastic film.

In addition, the present invention is a field-effect type transistor with amorphous oxides described in amorphous oxide film as a channel layer.

Here, using amorphous oxide film with electron carrier concentration less than $1\times10^{18}/cm^3$ and more than $1\times10^{15}/cm^3$ as a channel layer, a field-effect type transistor is configured by a source terminal, a drain terminal and, via gate insulating film, a gate terminal having been disposed. When voltage around 5 V is applied between the source and drain terminals, the current between the source and drain terminals at the time of no gate voltage being applied can be made to approximately $10^{-7}$ ampere.

Electron mobility of oxide crystals gets larger as overlapping of s orbitals of metal ions gets larger, oxide crystals of Zn, In and Sn with large atomic numbers has large electron mobility from 0.1 to 200 $cm^2/(V\cdot second)$. Moreover, in oxides, oxygen and metal ions are in ionic bonding. Therefore, chemical bonding lacks direction, and even in an amorphous state with the direction of bonding being not uniform, electron mobility will be able to derive a similar level compared with electron mobility in a crystal state. On the other hand, replacing Zn, In and Sn with elements with small atomic number, electron mobility drops. Based on such an outcome, electron mobility of amorphous oxides by the present invention is approximately from 0.01 cm$^2$/(V·second) to 20 cm$^2$/(V·second).

In case of making a channel layer of a transistor with the oxides, it is preferable to employ, for gate insulating film in a transistor, a mixed crystal compound containing at least not less than two kinds selected from the group consisting of $Al_2O_3$, $Y_2O_3$ and $HfO_2$ or their compounds. Presence of any defect on the interface between the gate insulating thin film and the channel layer thin film gives rise to an electron mobility drop and hysteresis in transistor characteristics. In addition, in accordance with types of gate insulating film, leak currents are significantly different. Therefore, it is necessary to select gate insulating film suitable to a channel layer. Use of $Al_2O_3$ film can reduce leak currents. In addition, use of $Y_2O_3$ film can drop hysteresis. Moreover, use of $HfO_2$ film with a high dielectric constant can increase field-effect mobility. In addition, using film made of a mixed crystal of these compounds, a TFT with few leak currents, little hysteresis and large field-effect mobility can be formed. In addition, gate insulating film forming process as well as channel layer forming process can be implemented at the room temperature, any of a staggered structure and an inverted staggered structure can be formed as a TFT structure.

$In_2O_3$ oxide film can be formed with a vapor method, and adding water of around 0.1 Pa to the atmosphere during film deposition, amorphous film is derived.

In addition, it is difficult to derive amorphous film from ZnO as well as $SnO_2$, but adding $In_2O_3$ in the amount of around 20 atomic percent in case of ZnO and in the amount of around 90 atomic percent in case of $SnO_2$, amorphous film can be derived. Particularly, in order to derive Sn—In—O system amorphous film, it is advisable that nitrogen gas of around 0.1 Pa is introduced into the atmosphere.

Composite oxides configuring elements of at least one kind selected from the group consisting of M2 (M2 being Mg and Ca) in element group 2 smaller than Zn in atomic number, M3 (M3 being B, Al, Ga and Y) in element group 3 smaller than In in atomic number, M4 (M4 being Si, Ge and Zr) in element group 4 smaller than Sn in atomic number, M5 (M5 being V, Nb and Ta) in element group 5, Lu and W can be added to the amorphous oxides. That can stabilize the amorphous film at the room temperature further. In addition, the composition range where amorphous film is derived can be expanded. Particularly, addition of B, Si and Ge that have strong covalent bond is effective for stabilizing the amorphous phase, and composite oxides configured by ions largely different in ion radius stabilize the amorphous phase. For example, in an In—Zn—O system, unless In falls within a composition range in excess of approximately 20 atomic percent, it is difficult to derive stable amorphous film at the room temperature, but adding equivalent amounts of Mg and, In, in the composition range of In in excess of approximately 15 atomic percent, stable amorphous film can be derived.

Controlling the atmosphere in film deposition with a vapor method, amorphous oxide film with electron carrier concentration less than $1 \times 10^{18}$/cm$^3$ and in excess of $1 \times 10^{15}$/cm$^3$ can be derived.

As a film deposition method of amorphous oxides, it is advisable to use a vapor method selected from the group consisting of pulsed laser deposition (PLD method), sputtering method (SP method) and electron beam deposition etc. Among vapor methods, the PLD method is appropriate in consideration of readily controllable material system composition and the SP method is suitable in consideration of mass production. However, film deposition methods will not be limited to these methods.

(Film Deposition of In—Zn—Ga—O System Amorphous Oxide Film with PLD Method)

With Pulsed Laser Deposition with use of KrF excimer laser, employing polycrystalline sintered compacts having $InGaO_3(ZnO)$ and $InGaO_3(ZnO)_4$ composition as respective targets, In—Zn—Ga—O system amorphous oxide film was deposited onto a glass substrate (product No. 1737 produced by Corning incorporated). As for a film deposition apparatus, an apparatus described in already described FIG. 48 was used and film deposition conditions were likewise in case of use of the apparatus. The substrate temperature is 25° C. Derived film underwent small angle X-ray scattering method (SAXS) of film surface (thin film method, at incident angle of 0.5 degree), clear diffraction peak was not detected, and any of In—Ga—Zn—O system film made from two kinds of targets were shown to be amorphous film.

Moreover, as a result of X ray reflection ratio measurement on In—Zn—Ga—O system amorphous oxide film on the glass substrate and pattern analyses, root-mean-square roughness (Rrms) of thin film was found to be approximately 0.5 nm and film thickness to be approximately 120 nm. As a result of X-ray fluorescence (XRF) analyses, the metal composition proportion of the film derived with a polycrystalline sintered compact having $InGaO_3(ZnO)$ composition as a target was In:Ga:Zn=1.1:1.1:0.9. In addition, the metal composition proportion of the film derived with a polycrystalline sintered compact having $InGaO_3(ZnO)_4$ composition as a target was In:Ga:Zn=0.98:1.02:4.

Causing oxygen partial pressures of the atmosphere at the time of film deposition to change, electron carrier concentration of amorphous oxide film derived by a polycrystalline sintered compact having $InGaO_3(ZnO)_4$ composition as a target was measured. The results thereof are shown in FIG. 1. Film deposition in an atmosphere with oxygen partial pressure in excess of 4.2 Pa enabled electron carrier concentration to drop to less than $1 \times 10^{18}$/cm$^3$. In this case, the substrate temperature is maintained approximately at the room temperature in a state of not intentionally increasing temperature. In addition, at the time when oxygen partial pressure is less than 6.5 Pa, the surface of the derived amorphous oxide film was flat.

At the time when oxygen partial pressure is 5 Pa, electron carrier concentration of amorphous oxide film derived by targeting a polycrystalline sintered compact having $InGaO_3(ZnO)_4$ composition was $1 \times 10^{16}$/cm$^3$ and electric conduction thereof was $10^{-2}$ S/cm. In addition, electron mobility was estimated to be approximately 5 cm$^2$/V·second. From analyses on the optical absorption spectrum, the energy range in optical bandgap of the made amorphous oxide film was derived to be approximately 3 eV.

Further increase in oxygen partial pressure enabled electron carrier concentration to drop further. As shown in FIG. 1, in case of In—Zn—Ga—O system amorphous oxide film having undergone film deposition at the substrate temperature of 25° C. and oxygen partial pressure of 6 Pa, electron carrier concentration was successfully made to drop to $8 \times 10^{15}$/cm$^3$ (electrical conductivity=approximately $8 \times 10^{-3}$ S/cm). The derived thin film was estimated to have electron mobility in excess of 1 cm$^2$/(V·second). However, in the PLD method, oxygen partial pressure of not less than 6.5 Pa made the surface of the deposited film into a relief state and became difficult for use as a channel layer of a TFT.

Targeting a polycrystalline sintered compact having $InGaO_3(ZnO)_4$ composition, In—Ga—Zn—O system amorphous oxide film formed with different oxygen partial pressure was studied on the relationship between electron carrier concentration and electron mobility. The results thereof are shown in FIG. 2. Increase in electron carrier concentration from $1\times10^{16}/cm^3$ to $1\times10^{20}/cm^3$ showed to give rise to increase in electron mobility from approximately 3 $cm^2/$(V·second) to approximately 11 $cm^2/$(V·second). In addition, as for amorphous oxide film derived by targeting a polycrystalline sintered compact having $InGaO_3(ZnO)$ composition, a likewise tendency was admitted.

Also in case of using polyethylene terephthalate (PET) film with thickness of 200 μm instead of the glass substrate, the derived In—Zn—Ga—O system amorphous oxide film showed likewise features.

(Film Deposition of In—Zn—Ga—Mg—O System Amorphous Oxide Film with PLD Method)

Employing polycrystalline $InGaO_3(Zn_{1-x}Mg_xO)_4$ ($0<x\leq1$) as a target, $InGaO_3(Zn_{1-x}Mg_xO)_4$ ($0<x\leq1$) film was deposited onto a glass substrate with a PLD method. As for a film deposition apparatus, an apparatus described in FIG. 48 was used.

As a substrate to undergo film deposition, $SiO_2$ glass substrate (product No. 1737 produced by Corning incorporated) was prepared. As prior treatment, that substrate underwent ultrasonic degreasing cleaning with acetone, ethanol and ultrapure water for 5 minutes each, and thereafter was dried at 100° C. in the atmosphere. As the target, an $InGa(Zn_{1-x}Mg_xO)_4$ (x=1–0) sintered compact (size 20 mmφ 5 mmt) was used. The target was made subject to wet blending of $In_2O_3$: $Ga_2O_3$:ZnO:MgO (respectively 4N reagent) (solvent: ethanol) as staring material and via temporary sintering (1000° C.: 2 h), dry ground and main sintering (1550° C.: 2 h). The base vacuum pressure in the growth room was $2\times10^{-6}$ (Pa) and oxygen partial pressure during growth was set to 0.8 (Pa). As for substrate temperature, the operation was implemented at the room temperature (25° C.) and the distance between the target and the substrate to undergo film deposition was 30 (mm). Here, the power of KrF excimer laser was set to 1.5 ($mJ/cm^2$/pulse), the pulse width to 20 (nsec), the repetition frequency to 10 (Hz) and the irradiation spot diameter to 1×1 (mm angle). The film deposition rate was 7 (nm/min). The oxygen partial pressure of the atmosphere is 0.8 Pa and the substrate temperature is 25° C. Derived film underwent small angle X-ray scattering method (SAXS) of film plane (thin film method, at incident angle of 0.5 degree), clear diffraction peak was not detected, and therefore the made In—Zn—Ga—Mg—O system film was shown to be amorphous film. The surface of the derived film was flat.

Figure 4:
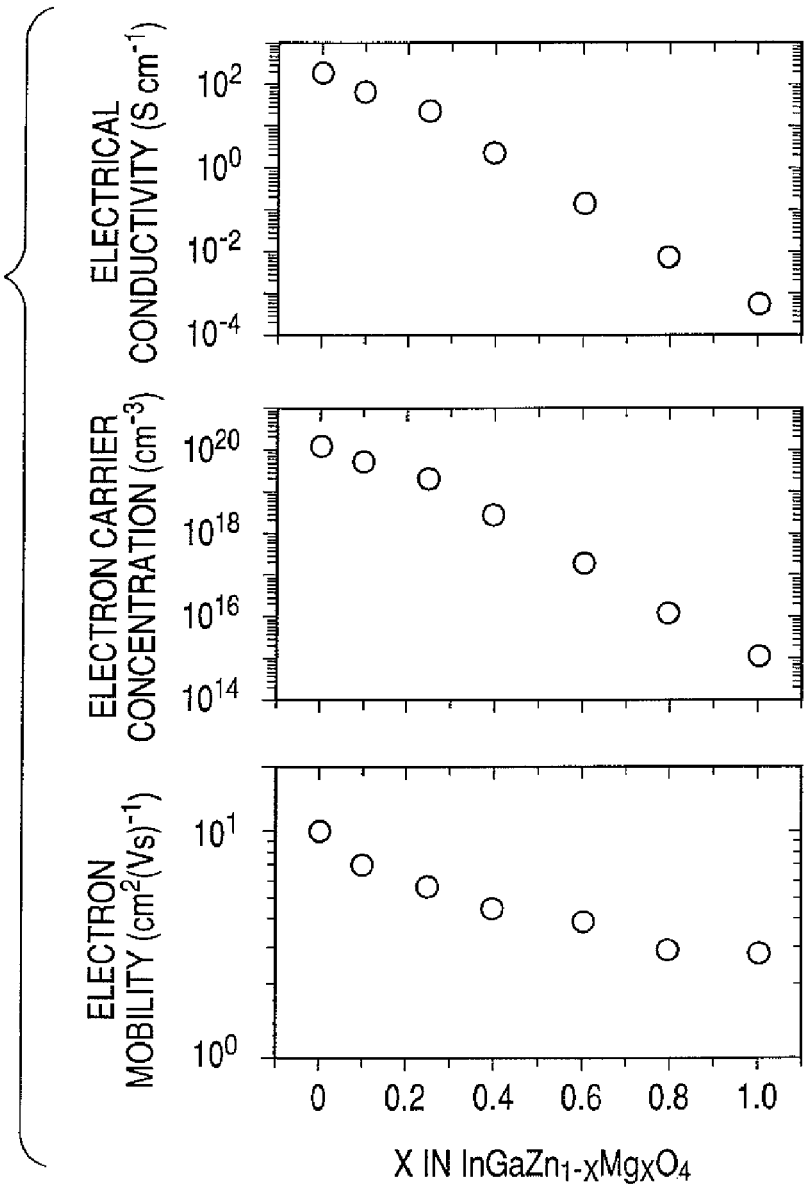
FIG. 4 is a graph showing variations in electric conductivity, carrier concentration, electron mobility for the value of x of InGaO₃ (Zn$_{1-x}$Mg$_x$O) having undergone film deposition with pulsed laser deposition in an atmosphere with oxygen partial pressure of 0.8 Pa.

Using targets with different x values, x-value dependency on electrical conductivity, electron carrier concentration and electron mobility of In—Zn—Ga—Mg—O system amorphous oxide film having undergone film deposition in an atmosphere with oxygen partial pressure of 0.8 Pa was examined. The results thereof are shown in FIG. 4. At the time of the x value in excess of 0.4, it was shown that the amorphous oxide film having undergone film deposition with a PLD method in an atmosphere with oxygen partial pressure of 0.8 Pa could derive electron carrier concentration less than $1\times10^{18}/cm^3$. In addition, as for amorphous oxide film with x value in excess of 0.4, electron mobility was in excess of 1 $cm^2/$(V·second).

As shown in FIG. 4, in case of using a target subject to replacement of Zn with Mg of 80 atomic percent, electron carrier concentration of film derived with pulsed laser deposition in an atmosphere of oxygen partial pressure of 0.8 Pa can be made to less than $1\times10^{16}/cm^3$ (electric resistance value is approximately $10^{-2}$ S/cm).

Electron mobility of such film drops compared with no Mg added film, but the level thereof is little, and electron mobility at the room temperature is approximately 5 $cm^2/$(V·second), presenting a value larger in approximately around one digit compared with amorphous silicon. In case of film deposition under the same conditions, electric conductivity and electron mobility drops together for increase in Mg content, and therefore, Mg content is preferably in excess of 20 atomic percent and less than 85 atomic percent (in terms of x, $0.2<x<0.85$ and more preferably $0.5<x<0.85$).

Also in case of using polyethylene terephthalate (PET) film with thickness of 200 μm instead of the glass substrate, the derived $InGaO_3(Zn_{1-x}Mg_xO)_4$ ($0<x\leq1$) amorphous oxide film showed likewise features.

(Film Deposition of $In_2O_3$ Amorphous Oxide Film with PLD Method)

With the PLD method with use of KrF excimer laser, targeting $In_2O_3$ polycrystalline sintered compact, $In_2O_3$ film was deposited onto PET film with thickness of 200 μm. As for an apparatus, an apparatus described in FIG. 48 was used. As a substrate to undergo film deposition, $SiO_2$ glass substrate (product No. 1737 produced by Corning incorporated) was prepared. As prior treatment, this substrate underwent ultrasonic degreasing cleaning with acetone, ethanol and ultrapure water for 5 minutes each, and thereafter was dried at 100° C. in the atmosphere. As the target, an $In_2O_3$ sintered compact (size 20 mmφ 5 mmt) was used. This was prepared by bringing staring material $In_2O_3$ (4N reagent) into temporary sintering (1000° C.: 2 h), dry ground and main sintering (1550° C.: 2 h). The base vacuum pressure in the growth room was set to $2\times10^{-6}$ (Pa), oxygen partial pressure during growth to 5 (Pa) and the substrate temperature to the room temperature. Oxygen partial pressure was set to 5 Pa and water vapor pressure to 0.1 Pa, and moreover, applying 200 W to oxygen radical generator to give rise to oxygen radicals.

The distance between the target and the substrate to undergo film deposition was 40 (mm), the power of KrF excimer laser was 0.5 ($mJ/cm^2$/pulse), the pulse width was 20 (nsec), the repetition frequency was 10 (Hz) and the irradiation spot diameter was 1×1 (mm angle). The film deposition rate was 3 (nm/min). Derived film underwent small angle X-ray scattering method (SAXS) of film plane (thin film method, at incident angle of 0.5 degree), clear diffraction peak was not detected, and therefore the made In—O system film was shown to be amorphous film. Film thickness was 80 nm.

Electron carrier concentration of the derived In—O system amorphous oxide film was $5\times10^{17}/cm^3$ and electron mobility was approximately 7 $cm^2/$(V·second).

(Film Deposition of In—Sn—O System Amorphous Oxide Film with PLD Method)

With the PLD method with use of KrF excimer laser, targeting $(In_{0.9}Sn_{0.1})O_{3.1}$ polycrystalline sintered compact, In—Sn—O system amorphous oxide film was deposited onto PET film with thickness of 200 μm In particular, as a substrate to undergo film deposition, $SiO_2$ glass substrate (product No. 1737 produced by Corning incorporated) was prepared. As prior treatment for the substrate, ultrasonic degreasing cleaning with acetone, ethanol and ultrapure water for 5 minutes each was implemented. Thereafter, it was dried at 100° C. in the atmosphere. As for the target, an $In_2O_3$—$SnO_2$ sintered compact (size 20 mmφ 5 mmt) was prepared. This is derived subject to wet blending of $In_2O_3$—$SnO_2$ (4N reagent) (solvent: ethanol) as staring material and via temporary sintering (1000° C.: 2 h), dry ground and main sintering (1550° C.: 2 h).

The substrate temperature is the room temperature. Oxygen partial pressure was set to 5 Pa and nitrogen partial pressure to 0.1 Pa, and moreover, applying 200 W to oxygen radical generator to give rise to oxygen radicals.

The distance between the target and the substrate to undergo film deposition was 30 (mm), the power of KrF excimer laser was 1.5 (mJ/cm$^2$/pulse), the pulse width was 20 (nsec), the repetition frequency was 10 (Hz) and the irradiation spot diameter was 1×1 (mm angle). The film deposition rate of 6 (nm/min).

Derived film underwent small angle X-ray scattering method (SAXS) of film plane (thin film method, at incident angle of 0.5 degree), clear diffraction peak was not detected, and therefore the made In—Sn—O system film was shown to be amorphous film.

Electron carrier concentration of the derived In—Sn—O system amorphous oxide film was 8×10$^{17}$/cm$^3$ and electron mobility was approximately 5 cm$^2$/(V·second). Film thickness was 100 nm.

(Film Deposition of In—Ga—O System Amorphous Oxide Film with PLD Method)

As a substrate to undergo film deposition, SnO$_2$ glass substrate (product No. 1737 produced by Corning incorporated) was prepared. As prior treatment for the substrate, ultrasonic degreasing cleaning with acetone, ethanol and ultrapure water for 5 minutes each were implemented and thereafter was dried at 100° C. in the atmosphere. As the target, an (In$_2$O$_3$)$_{1-x}$—(Ga$_2$O$_3$)$_x$ (X=0–1) sintered compact (size 20 mmφ 5 mmt) was prepared. Here, for example, in case of x=0.1, the target will be a (In$_{0.9}$Ga$_{0.1}$)$_2$O$_3$ polycrystalline sintered compact.

This is derived subject to wet blending of staring material: In$_2$O$_3$—Ga$_2$O$_2$ (4N reagent) (solvent:
ethanol) and via temporary sintering (1000° C.: 2 h), dry ground and main sintering (1550° C.: 2h). The base vacuum pressure in the growth room was 2×10$^{-6}$ (Pa) and oxygen partial pressure during growth was set to 1 (Pa). As for substrate temperature, the operation was implemented at the room temperature, the distance between the target and the substrate to undergo film deposition was 30 (mm), the power of KrF excimer laser was 1.5 (mJ/cm$^2$/pulse), the pulse width was 20 (nsec), the repetition frequency was 10 (Hz) and the irradiation spot diameter was 1×1 (mm angle). The film deposition rate was 6 (nm/min). The substrate temperature is 25° C. The oxygen partial pressure was 1 Pa. Derived film underwent small angle X-ray scattering method (SAXS) of film plane (thin film method, at incident angle of 0.5 degree), clear diffraction peak was not detected, and therefore the made In—Ga—0 system film was shown to be amorphous film. Film thickness was 120 nm.

Electron carrier concentration of the derived In—Ga—O system amorphous oxide film was 8×10$^{16}$/cm$^3$ and electron mobility was approximately 1 cm$^2$/(V·second).

(Fabrication of TFT Element with Use of In—Zn—Ga—O System Amorphous Oxide Film (Glass Substrate)) Fabrication of TFT Element A top gate type TFT element shown in FIG. 5 was made. At first, In—Ga—Zn—O system amorphous oxide film was made on a glass substrate (1) with the PLD apparatus under a condition of oxygen partial pressure of 5 Pa with a polycrystalline sintered compact having InGaO$_3$(ZnO)$_4$ composition as a target. In—Ga—Zn—O system amorphous oxide film with thickness of 120 nm to be used as a channel layer (2) was formed. Moreover thereon, setting the oxygen partial pressure inside the chamber to less than 1 Pa, laminating 30 nm respectively of In—Zn—Ga—O system amorphous film having large electrical conductivity and gold film with the PLD method, a drain terminal (5) and a source terminal (6) were formed with a photolithography method and a liftoff method.

Lastly, bringing Y$_2$O$_3$ film to be used as gate insulating film (3) into film deposition with electron beam deposition (thickness: 90 nm, relative permittivity: approximately 15, leak current concentration: 10$^{-3}$ A/cm$^2$ at the time of applying 0.5 MV/cm), and bringing gold into film deposition thereon, a gate terminal (4) was formed with a photolithography method and a liftoff method. Channel length was 50 μm and channel width was 200 μm.

Assessment on Features of TFT Element

FIG. 6 shows current-voltage features of a TFT element measured under the room temperature. It is found that the channel is an n-type conduction since the drain current I$_{DS}$ increased as the drain voltage V$_{DS}$ increased. This does not contradict the fact that the amorphous In—Ga—Zn—O system amorphous oxide film is an n-type conductor. I$_{DS}$ showed a typical behavior of semiconductor transistor that is saturated (pinched off) around V$_{DS}$=6 V. Examination on gain features derived the threshold value of the gate voltage V$_{GS}$ of approximately −0.5 V at the time of applying V$_{DS}$=4 V. In addition, at the time of V$_{GS}$=10V, the current of I$_{DS}$=1.0×10$^{-5}$ A flowed. This corresponds with successful induction of carriers inside In—Ga—Zn—O system amorphous oxide film of an insulator with gate bias.

ON•OFF proportion of the transistor was in excess of 10$^3$. In addition, calculation of field effect mobility from output features derived field effect mobility of approximately 7 cm$^2$ (Vs)$^{-1}$ in the saturated region. Likewise measurement was implemented on the made element with irradiation of visible light, but no change in the transistor features was admitted. Here, setting electron carrier concentration in the amorphous oxides to less than 1×10$^{18}$/cm$^3$, it is applicable for the channel layer of TFT.

This electron carrier concentration of not more than 1×10$^{17}$/cm$^3$ was more preferable and not more than 1×10$^{16}$/cm$^3$ was much more preferable. (Fabrication of TFT element with use of In—Zn—Ga—O system amorphous oxide film (amorphous substrate))

A top gate type TFT element shown in FIG. 5 was made. At first, targeting a polycrystalline sintered compact having InGaO$_3$(ZnO) composition, In—Ga—Zn—O system amorphous oxide film with thickness of 120 nm to be used as a channel layer (2) was formed on polyethylene terephthalate (PET) film (1) with the PLD method in an atmosphere with oxygen partial pressure of 5 Pa. Moreover thereon, setting the oxygen partial pressure inside the chamber to less than 1 Pa, laminating 30 nm respectively of In—Zn—Ga—O system amorphous oxide film having large electrical conductivity and gold film with the PLD method, a drain terminal (5) and a source terminal (6) were formed with a photolithography method and a liftoff method. Lastly, depositing gate insulating film (3) with electron beam deposition, and bringing gold into film deposition thereon, a gate terminal (4) was formed with a photolithography method and a liftoff method. Channel length was 50 μm and channel width was 200 μm. Three types of TFTs having the above mentioned structure with use of Y$_2$O$_3$ (thickness: 140 nm), Al$_2$O$_3$ (thickness: 130 μm) and HfO$_2$ (thickness: 140 μm) as a gate insulating film were formed.

Assessment on Features of TFT Element

Current-voltage features of the TFTs formed on PET film measured under the room temperature were likewise in FIG. 6. That is, it is found that the channel is an n-type conduction since the drain current I$_{DS}$ increased as the drain voltage V$_{DS}$ increased. This does not contradict the fact that the amorphous In—Ga—Zn—O system amorphous oxide film is an n-type conductor. I$_{DS}$ showed a typical behavior of semiconductor transistor that is saturated (pinched off) around V$_{DS}$=6

V. In addition, at the time of $V_g$=0V, the current of $I_{ds}$=$10^{-8}$ A flowed and at the time of $V_g$=10V, the current of $I_{DS}$=2.0×$10^{-5}$ A flowed. This corresponds with successful induction of electron carriers inside In—Ga—Zn—O system amorphous oxide film of an insulator with gate bias.

ON•OFF proportion of the transistor was in excess of $10^3$. In addition, calculation of field effect mobility from output features derived field effect mobility of approximately 7 $cm^2 (Vs)^{-1}$ in the saturated region.

Flexing the element made on the PET film at the curvature radius of 30 mm, likewise measurement on transistor features was implemented, but no change in the transistor features was admitted. In addition, likewise measurement was implemented with irradiation of visible light, but no change in the transistor features was admitted.

The TFT with use of $Al_2O_3$ film as gate insulating film also showed transistor features similar to those shown in FIG. 6, but at the time of $V_g$=0, the current of $I_{ds}$=$10^{-8}$ A flowed and at the time of $V_g$=10 V, the current of $I_{DS}$=5.0×$10^{-6}$ A flowed.

ON•OFF proportion of the transistor was in excess of $10^2$. In addition, calculation of field effect mobility from output features derived field effect mobility of approximately 2 $cm^2 (Vs)^{-1}$ in the saturated region.

The TFT with use of $HfO_2$ film as gate insulating film also showed transistor features similar to those shown in FIG. 6, but at the time of $V_g$=0, the current of $I_{ds}$=$10^{-8}$ A flowed and at the time of $V_g$=10 V, the current of $I_{DS}$=1.0×$10^{-6}$ A flowed.

ON•OFF proportion of the transistor was in excess of $10^2$. In addition, calculation of field effect mobility from output features derived field effect mobility of approximately 10 $cm^2(Vs)^{-1}$ in the saturated region.

(Fabrication of TFT Element with PLD Method with Use of $In_2O_3$ Amorphous Oxide Film)

A top gate type TFT element shown in FIG. 5 was made. At first, $In_2O_3$ amorphous oxide film with thickness of 80 nm to be used as a channel layer (2) was formed on polyethylene terephthalate (PET) film (1) with the PLD method. Moreover thereon, setting the oxygen partial pressure inside the chamber to less than 1 Pa, and moreover setting the voltage applied to the oxygen radical generator to zero, laminating 30 nm respectively of $In_2O_3$ amorphous oxide film having large electrical conductivity and gold film with the PLD method, a drain terminal (5) and a source terminal (6) were formed with a photolithography method and a liftoff method. Lastly, depositing $Y_2O_3$ to be used as gate insulating film (3) with electron beam deposition, and bringing gold into film deposition thereon, a gate terminal (4) was formed with a photolithography method and a liftoff method.

Assessment on Features of TFT Element

Current-voltage features of the TFT formed on PET film were measured under the room temperature. It is found that the channel is an n-type semiconductor since the drain current $I_{DS}$ increased as the drain voltage $V_{DS}$ increased. This does not contradict the fact that the In—O system amorphous oxide film is an n-type conductor. $I_{DS}$ showed a typical behavior of transistor that is saturated (pinched off) around $V_{DS}$=5 V. In addition, at the time of $V_g$=0V, the current of 2×$10^{-8}$ A flowed and at the time of $V_g$=10V, the current of $I_{DS}$=2.0×$10^{-6}$ A flowed. This corresponds with successful induction of electron carriers inside In—O system amorphous oxide film of an insulator with gate bias.

ON•OFF proportion of the transistor was approximately $10^2$. In addition, calculation of field effect mobility from output features derived field effect mobility of approximately 10 $cm^2(Vs)^{-1}$ in the saturated region. The TFT element made on a glass substrate also showed likewise features.

Flexing the element made on the PET film at the curvature radius of 30 mm, likewise measurement on transistor features was implemented, but no change in the transistor features was admitted.

(Fabrication of TFT Element with PLD Method with Use of In—Sn—O System Amorphous Oxide Film)

A top gate type TFT element shown in FIG. 5 was made. At first, In—Sn—O system amorphous oxide film with thickness of 100 nm to be used as a channel layer (2) was formed on polyethylene terephthalate (PET) film (1) with the PLD method. Moreover thereon, setting the oxygen partial pressure inside the chamber to less than 1 Pa, and moreover setting the voltage applied to the oxygen radical generator to zero, laminating 30 nm respectively of In—Sn—O system amorphous oxide film having large electrical conductivity and gold film with the PLD method, a drain terminal (5) and a source terminal (6) were formed with a photolithography method and a liftoff method. Lastly, depositing $Y_2O_3$ film to be used as gate insulating film (3) with electron beam deposition, and bringing gold into film deposition thereon, a gate terminal (4) was formed with a photolithography method and a liftoff method.

Assessment on Features of TFT Element

Current-voltage features of the TFT formed on PET film were measured under the room temperature.

It is found that the channel is an n-type semiconductor since the drain current $I_{DS}$ increased as the drain voltage $V_{DS}$ increased. This does not contradict the fact that the In—Sn—O system amorphous oxide film is an n-type conductor. $I_{DS}$ showed a typical behavior of semiconductor transistor that is saturated (pinched off) around $V_{DS}$=6 V. In addition, at the time of $V_g$=0V, the current of 5×$10^{-8}$ A flowed and at the time of $V_g$=10 V, the current of $I_{DS}$=5.0×$10^{-5}$ A flowed. This corresponds with successful induction of electron carriers inside In—Sn—O system amorphous oxide film of an insulator with gate bias.

ON•OFF proportion of the transistor was approximately $10^3$. In addition, calculation of field effect mobility from output features derived field effect mobility of approximately 5 $cm^2(Vs)^{-1}$ in the saturated region. The TFT element made on a glass substrate also showed likewise features.

Flexing the element made on the PET film at the curvature radius of 30 mm, likewise measurement on transistor features was implemented, but no change in the transistor features was admitted.

(Fabrication of TFT Element with PLD Method with Use of In—Ga—O System Amorphous Oxide Film)

A top gate type TFT element shown in FIG. 5 was made. At first, In—Ga—O system amorphous oxide film with thickness of 120 nm to be used as a channel layer (2) was formed on polyethylene terephthalate (PET) film (1) with the film deposition method described in Example 6. Moreover thereon, setting the oxygen partial pressure inside the chamber to less than 1 Pa, and moreover setting the voltage applied to the oxygen radical generator to zero, laminating 30 nm respectively of In—Ga—O system amorphous oxide film having large electrical conductivity and gold film with the PLD method, a drain terminal (5) and a source terminal (6) were formed with a photolithography method and a liftoff method. Lastly, depositing $Y_2O_3$ film to be used as gate insulating film (3) with electron beam deposition, and bringing gold into film deposition thereon, a gate terminal (4) was formed with a photolithography method and a liftoff method.

Assessment on Features of TFT Element

Current-voltage features of the TFT formed on PET film were measured under the room temperature. It is found that the channel is an n-type semiconductor since the drain current $I_{DS}$ increased as the drain voltage $V_{DS}$ increased. This does not contradict the fact that the In—Ga—O system amorphous oxide film is an n-type conductor. $I_{DS}$ showed a typical behavior of semiconductor transistor that is saturated (pinched off) around $V_{DS}$=6 V. In addition, at the time of $V_g$=0 V, the current of $1 \times 10^{-8}$ A flowed and at the time of $V_g$=10 V, the current of $I_{DS}$=$1.0 \times 10^{-6}$ A flowed. This corresponds with successful induction of electron carriers inside In—Ga—O system amorphous oxide film of an insulator with gate bias.

ON•OFF proportion of the transistor was approximately $10^2$. In addition, calculation of field effect mobility from output features derived field effect mobility of approximately 0.8 cm$^2$(Vs)$^{-1}$ in the saturated region. The TFT element made on a glass substrate also showed likewise features.

Flexing the element made on the PET film at the curvature radius of 30 mm, likewise measurement on transistor features was implemented, but no change in the transistor features was admitted. Here, setting electron carrier concentration in the amorphous oxides to less than $1 \times 10^{18}$/cm$^3$, it is applicable for the channel layer. This electron carrier concentration of not more than $1 \times 10^{17}$/cm$^3$ was more preferable and not more than $1 \times 10^{16}$/cm$^3$ was much more preferable.

EXAMPLE 1

SIT Element with use of the Transparent Film

Figure 7:
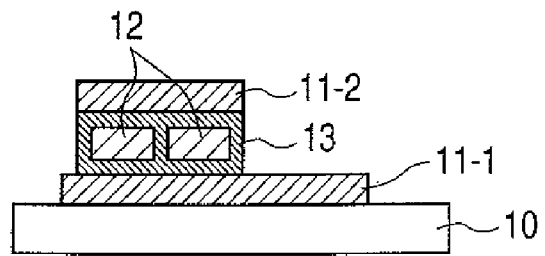
FIG. 7 is a diagram showing Example 1 of an SIT element.

As shown in FIG. 7, an ITO thin film of 30 nm is formed with pulsed laser deposition on an insulating substrate 10 made of such as glass and plastic etc., and the drain electrode 11-1 undergoes patterning with a photolithography method and a liftoff method. Subsequently, an In—Ga—Zn—O system amorphous N-type semiconductor 13 of 30 nm is formed with pulsed laser deposition, and the In—Ga—Zn—O system amorphous N-type semiconductor film is formed with a photolithography method and a liftoff method on the electrode 11-1. Thereafter, as an electrode 12, Pt thin film of 30 nm is formed with pulse laser deposition and undergoes patterning with a photolithography method and a liftoff method on the semiconductor film so as to resemble the teeth of a comb. Moreover, the In—Ga—Zn—O system amorphous N-type semiconductor 13 of 30 nm is formed with pulsed laser deposition, and the In—Ga—Zn—O system amorphous N-type semiconductor undergoes patterning with a photolithography method and a liftoff method so as to cover the gate electrode 12. In this regard, the semiconductor film is preferably higher in carrier concentration and conductivity than semiconductor film formed on the drain electrode, and those with carrier concentration of not more than $1 \times 10^{18}$/cm$^3$ will do as well. Lastly, ITO film of 30 nm is formed on the In—Ga—Zn—O system amorphous N-type semiconductor and undergoes patterning with a photolithography method and a liftoff method to form source electrode 11-2. The means can make an SIT element (in FIG. 7).

A current that flows between the drain electrode and source electrode of the SIT element is determined by how potential barrier formed in accordance with voltage applied to the gate electrode 12 is caused to drop with voltage applied between the drain electrode and source electrode. In addition, due to the short distance between the drain and source, a large current compared with a TFT can be caused to flow.

Figure 8:
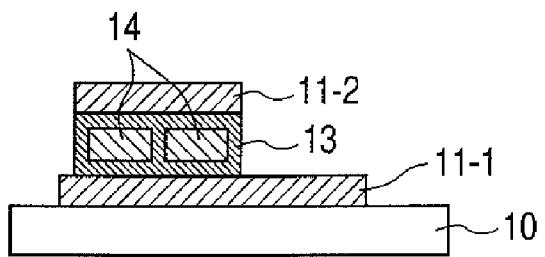
FIG. 8 is a diagram showing Example 2 of an SIT element.

Using, in the SIT element, P-type semiconductor 14 having the absolute value of the Fermi level larger than the absolute value of the Fermi level of the In—Ga—Zn—O system amorphous N-type semiconductor instead of Pt of forming the gate electrode 12, a likewise SIT element can be made (in FIG. 8).

Figure 10:
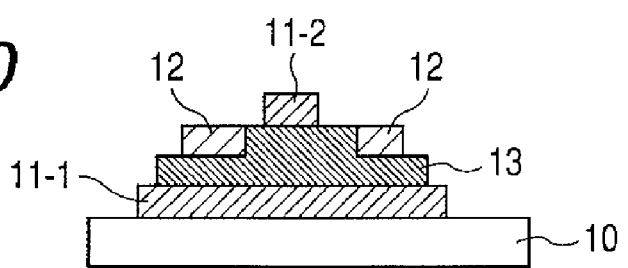
FIG. 10 is a diagram showing Example 4 of an SIT element.

In addition, for an SIT element with the same function as well, configurations shown in FIGS. 9 and 10 also are feasible.

EXAMPLE 2

SBT Element with use of the Transparent Film

Figure 11:
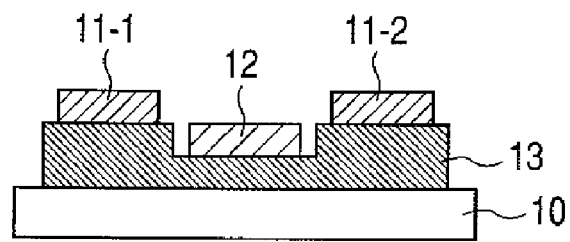
FIG. 11 is a diagram showing an Example of an SBT element.

As shown in FIG. 11, the In—Ga—Zn—O system amorphous N-type semiconductor 13 of 30 nm is formed with pulsed laser deposition on an insulating substrate 10 made of such as glass and plastic etc., and the In—Ga—Zn—O system amorphous N-type semiconductor film having undergone patterning with a photolithography method and a liftoff method is formed. Subsequently, the In—Ga—Zn—O system amorphous N-type semiconductor 13 of 30 nm is further formed on the semiconductor film and undergoes patterning with a photolithography method and a liftoff method so that the portion corresponding to the gate electrode configures a concave shape. Thereafter, as the gate electrode 12, Pt thin film of 30 nm is formed with pulse laser deposition and the concave portion of the semiconductor film undergoes patterning with a photolithography method and a liftoff method. Moreover, in the convex portion of the In—Ga—Zn—O system amorphous N-type semiconductor, ITO film of 30 nm is formed and undergoes patterning with a photolithography method and a liftoff method to form thereby a drain electrode 11-1 and a source electrode 11-2. The means can make an SBT element (in FIG. 11).

Here, the fabrication order of the gate, drain and source electrodes may be rearranged.

A current that flows between the drain electrode and source electrode of the SBT element is determined by increase and decrease in size of the current path between the drain electrode and source electrode since the size of a depletion region formed in accordance with voltage applied to the gate electrode 2 changes. Unlike a TFT, the SBT element does not require an insulating layer, and therefore can be advantageously formed with a simple element structure.

EXAMPLE 3

Fabrication of PN-T Element with use of the Transparent Film

As shown in FIG. 12, the In—Ga—Zn—O system amorphous N-type semiconductor 13 of 30 nm is formed with pulsed laser deposition on an insulating substrate 10 made of such as glass and plastic etc., and the In—Ga—Zn—O system amorphous N-type semiconductor film having undergone patterning with a photolithography method and a liftoff method is formed. Subsequently, the In—Ga—Zn—O system amorphous N-type semiconductor 13 of 30 nm is further formed on the semiconductor film and undergoes patterning with a photolithography method and a liftoff method so that the portion corresponding to the gate electrode configures a concave shape. Thereafter, in the concave portion of the semiconductor film, P-type semiconductor film 14 of 30 nm having the absolute value of the Fermi level larger than the absolute value of the Fermi level of the In—Ga—Zn—O system amorphous N-type semiconductor is formed with pulsed laser deposition, a photolithography method and a liftoff method. Moreover, as the gate electrode 12, Pt thin film of 30 nm is formed with pulse laser deposition and the surface of the P-type semiconductor film undergoes patterning with a photolithography method and a liftoff method. Lastly, in the convex portion of the In—Ga—Zn—O system amorphous N-type semiconductor, ITO film of 30 nm is formed and undergoes patterning with a photolithography method and a liftoff method to form thereby a drain electrode 11-1 and a source electrode 11-2. The means can make an PN-T element (in FIG. 12).

Here, the fabrication order of the gate, drain and source electrodes may be rearranged.

A current that flows between the drain electrode and source electrode of the PN-T element is determined by increase and decrease in size of the current path between the drain electrode and source electrode since the size of a depletion region formed inside the N-type semiconductor changes in accordance with voltage applied to the gate electrode 2. Unlike a TFT, the PN-T element advantageously requires no insulating layer.

EXAMPLE 4

SD Element with use of the Transparent Film

Figure 13:
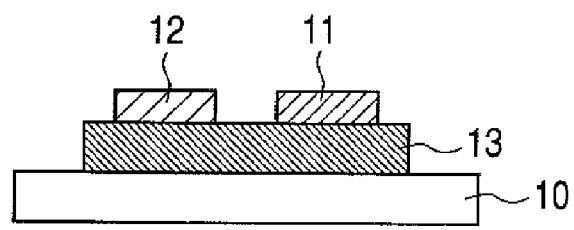
FIG. 13 is a diagram showing an Example of an SBD element.

As shown in FIG. 13, the In—Ga—Zn—O system amorphous N-type semiconductor 13 of 30 nm is formed with pulsed laser deposition on an insulating substrate 10 made of such as glass and plastic etc., and the In—Ga—Zn—O system amorphous N-type semiconductor film having undergone patterning with a photolithography method and a liftoff method is formed. Subsequently, as an electrode 12, Pt thin film of 30 nm is formed with pulse laser deposition on the semiconductor and undergoes patterning with a photolithography method and a liftoff method. Moreover, as an electrode 11, ITO film of 30 nm is formed with pulse laser deposition on the semiconductor and undergoes patterning with a photolithography method and a liftoff method. The means can make an SD element (in FIG. 13).

Here, the fabrication order of the electrode 11 and electrode 12 may be rearranged.

The SD element will get the rectifying nature with the Schottky barrier formed between the electrode 12 and the semiconductor film 13.

EXAMPLE 5

PN-D Element with use of the Transparent Film

As shown in FIG. 14, the In—Ga—Zn—O system amorphous N-type semiconductor 13 of 30 nm is formed with pulsed laser deposition on an insulating substrate 10 made of such as glass and plastic etc., and the In—Ga—Zn—O system amorphous N-type semiconductor film having undergone patterning with a photolithography method and a liftoff method is formed. Subsequently, on the semiconductor, P-type semiconductor film 14 of 30 nm having the absolute value of the Fermi level larger than the absolute value of the Fermi level of the In—Ga—Zn—O system amorphous N-type semiconductor is formed with pulsed laser deposition and undergoes patterning with a photolithography method and a liftoff method. Moreover, as an electrode 12, Pt of 30 nm is formed with pulse laser deposition on the P-type semiconductor and undergoes patterning with a photolithography method and a liftoff method. Lastly, as an electrode 11, ITO film of 30 nm is formed with pulsed laser deposition on the N-type semiconductor and undergoes patterning with a photolithography method and a liftoff method. The means can make an PN-D element (in FIG. 14).

Here, the fabrication order of the electrode 11 and electrode 12 may be rearranged.

The PN-D element will get the rectifying nature with a PN-junction formed between the semiconductor film 13 and the semiconductor film 14.

EXAMPLE 6

Resistance Element with use of the Transparent Film

Figure 15:
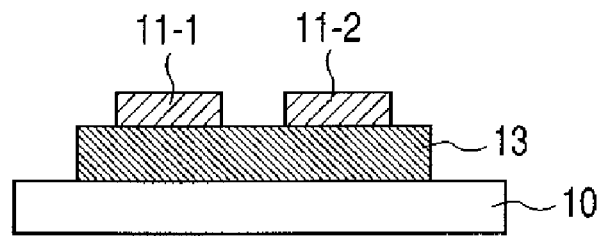
FIG. 15 is a diagram showing Example 1 of a resistance element.

As shown in FIG. 15, the In—Ga—Zn—O system amorphous N-type semiconductor 13 of 30 nm is formed with pulsed laser deposition on an insulating substrate 10 made of such as glass and plastic etc., and the In—Ga—Zn—O system amorphous N-type semiconductor film having undergone patterning with a photolithography method and a liftoff method is formed. Subsequently, as electrodes 11-1 and 11-2, ITO film of 30 nm is formed with pulsed laser deposition on the N-type semiconductor film and undergoes patterning with a photolithography method and a liftoff method. The means can make a transparent resistance element (in FIG. 15).

Figure 16:
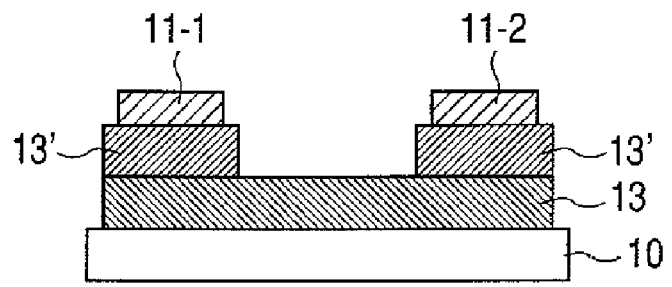
FIG. 16 is a diagram showing Example 2 of a resistance element.

In addition, the resistance element may comprise, between the electrodes 11-1 and 11-2 and the semiconductor 13, an In—Ga—Zn—O system amorphous N-type semiconductor 13' different from the semiconductor in carrier concentration and conductivity (FIG. 16).

Unless otherwise specified, for the case of an N-TFT, the following description will refer to an MISFET in normally OFF (enhancement type) with use of the transparent film.

EXAMPLE 7

Inverter Circuit with Use of TFT with the Transparent Film as Active Layer

Figure 17:
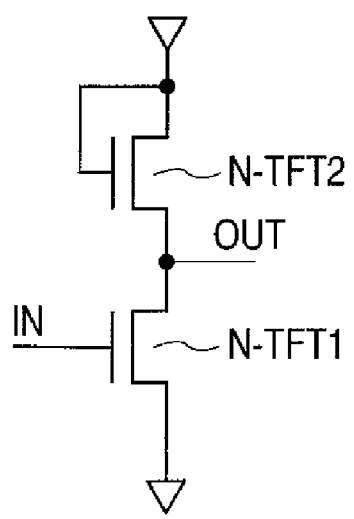
FIG. 17 is a diagram showing an inverter circuit 1 of Example 1.

N-TFTs 1 and 2 with the transparent film as an active layer being an N-type semiconductor is connected in series between the power supply and the GND, the gate of the N-TFT 2, the drain of which is connected to the power supply, is connected to the power supply, taking the gate of the N-TFT 1, the source of which is connected to the ground GND, as input and the drain thereof as output, and thereby an inverter circuit is realized (in FIG. 17).

Figure 18:
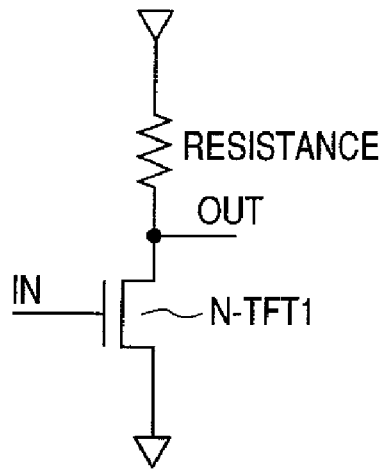
FIG. 18 is a diagram showing an inverter circuit 2 of Example 1.
Figure 19:
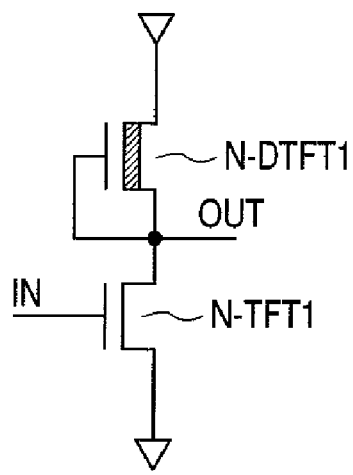
FIG. 19 is a diagram showing an inverter circuit 3 of Example 1.

In addition, instead of the N-TFT 2, also using the transparent film as resistance, an inverter circuit can be configured (in FIG. 18).

In addition, as a method of improving the output rising capability than in the inverter, N-type depletion-type transistor (hereinafter to be referred to as N-DTFT) N-DTFT 1 with the gate and source having been short-circuited can be used instead of N-TFT 2.

Figure 20:
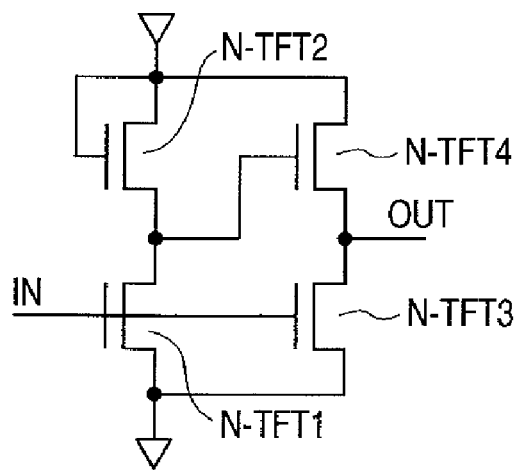
FIG. 20 is a diagram showing an inverter circuit 4 of Example 1.
Figure 21:
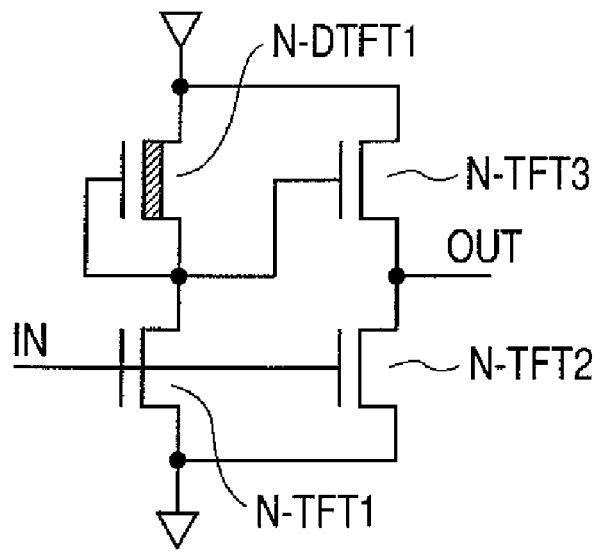
FIG. 21 is a diagram showing an inverter circuit 5 of Example 1.

With the inverter circuit, the output in case of input being in a high level will give a low level, and voltage thereof is determine by partial voltage of the N-TFT 1 and N-TFT 2 (or resistance and N-DTFT 1), and therefore, in order to derive low level output, current allowance of the N-TFT 2 is made to drop compared with the N-TFT 1. Thereby, charging capability of output will drop. In contrast, in case of 2-stage type inverter circuit (in FIGS. 20 and 21) comprising an N-TFT 4 taking output of the inverter as a gate and the power source as a drain and an N-TFT 3 being present between the source of the N-TFT 4 and the GND and taking input of the inverter as a gate, wherein a drain of the N-TFT 3 is taken as output, the N-TFT 4 is in a source follower configuration and can enhance charging capability of output.

Figure 47:
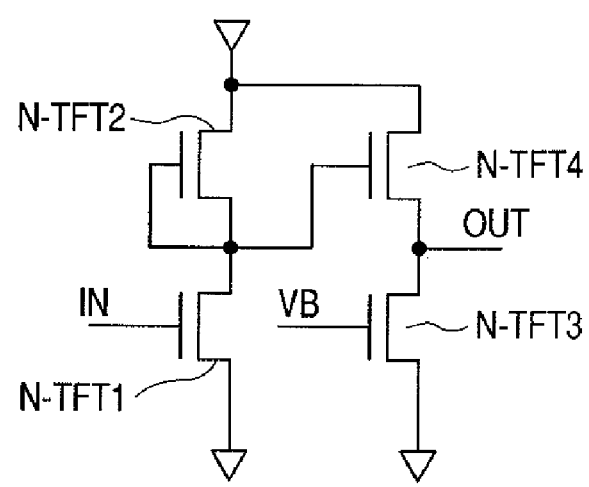
FIG. 47 is a diagram showing an inverter circuit 7 of Example 1.

In addition, as an example of 2-stage type inverter circuit, a configuration in FIG. 47 is feasible.

Figure 22:
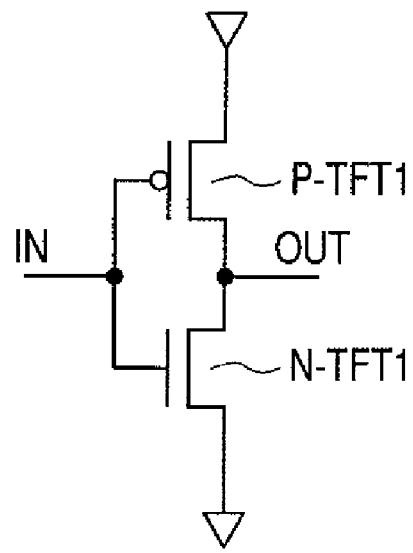
FIG. 22 is a diagram showing an inverter circuit 6 of Example 1.

Moreover, using P-type TFT (P-TFT1) with P-type semiconductor as an active layer in the inverter circuit instead of the N-TFT 2, resistance and N-DTFT 1, a complementary inverter circuit with no static pass-through current and with high drive capability can be configured (in FIG. 22).

As P-type semiconductor, inorganic semiconductors of Si etc., organic semiconductors of pentacene-polythiophene etc. and oxide semiconductors are considered, and if a bottom gate structure is feasible as a TFT, from the point of view of process simplicity, use of organic semiconductors derivable with mask deposition and ink-jet enables a configuration of the complementary inverter easily. On the other hand, in case of making the complementary inverter with a P-type oxide semiconductor, a circuit with the semiconductor part being transparent can be advantageously made.

EXAMPLE 8

Figure 23:
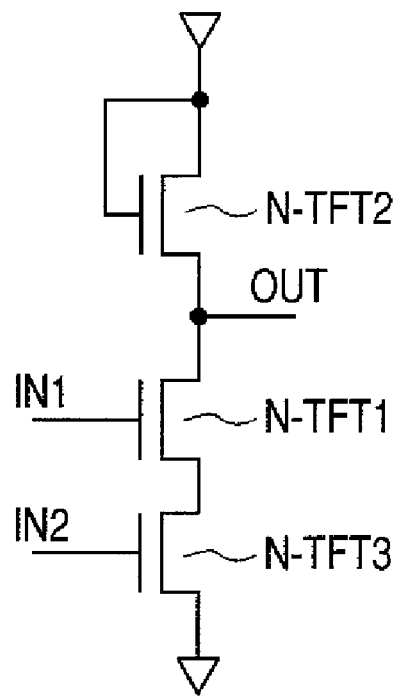
FIG. 23 is a diagram showing a NAND circuit 1 of Example 2.

NAND and NOR Circuits with Use of TFT with the Transparent Film as Active Layer Inserting an N-TFT 3 between the GND and a source of n N-TFT 1 of an inverter with use of N-TFTs 1 and 2 with the transparent film as an active layer being an N-type semiconductor and taking a gate of the N-TFT 1 as a first input (IN 1) and a gate of the N-TFT 3 as a second input (IN 2), a NAND circuit can be configured (in FIG. 23).

Figure 24:
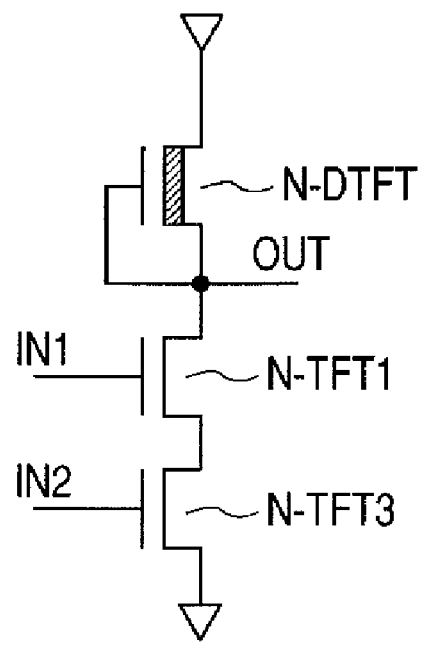
FIG. 24 is a diagram showing a NAND circuit 2 of Example 2.

In addition, likewise the inverter, instead of N-TFT 2, use of N-DTFT 1 (in FIG. 24) with the gate and source having been short-circuited or resistance enables a configuration of the NAND circuit.

Figure 25:
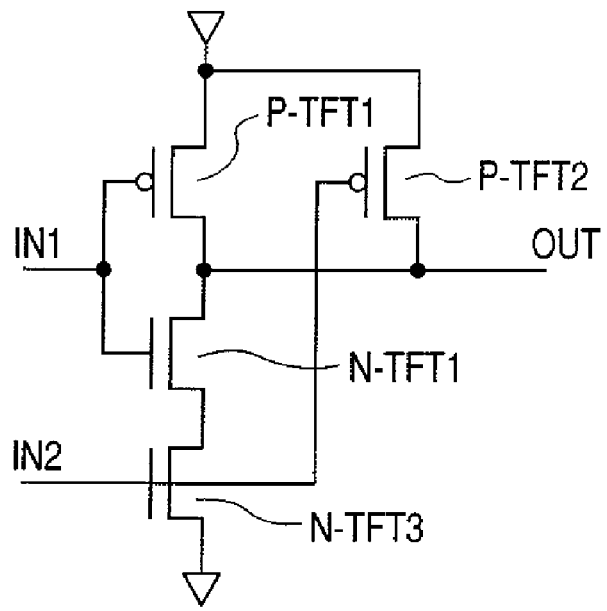
FIG. 25 is a diagram showing a NAND circuit 3 of Example 2.

Moreover, in case of using a P-type TFT with a P-type semiconductor as an active layer, instead of the N-TFT 2, two P-type TFTs, that is, the P-TFT 1 and the P-TFT 2, are brought into connection in parallel between the power supply and the output and the respective gates are taken as the IN 1 and IN 2, and thereby a NAND circuit can be configured (in FIG. 25).

Figure 26:
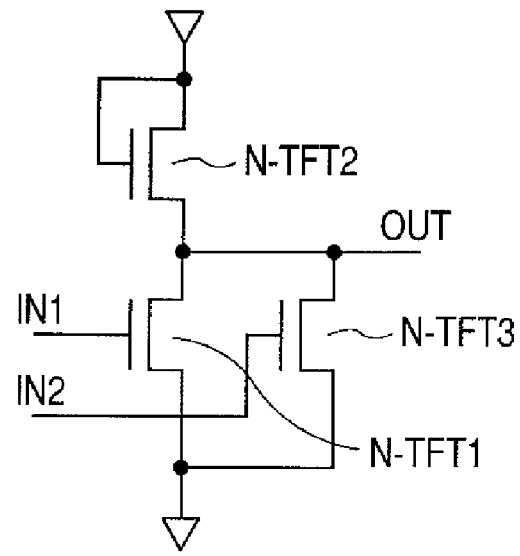
FIG. 26 is a diagram showing a NOR circuit 1 of Example 2.

On the other hand, inserting an N-TFT 3 in parallel to the N-TFT 1 of an inverter with use of N-TFTs 1 and 2 with the transparent film as an active layer being an N-type semiconductor and taking a gate of the N-TFT 1 as a first input (IN 1) and a gate of the N-TFT 3 as a second input (IN 2), a NOR circuit can be configured (in FIG. 26).

Figure 27:
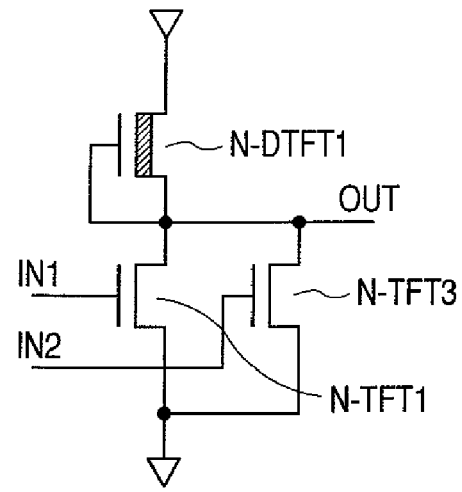
FIG. 27 is a diagram showing a NOR circuit 2 of Example 2.

In addition, likewise the inverter, instead of N-TFT 2, use of N-DTFT 1 (in FIG. 27) with the gate and source having been short-circuited or resistance enables a configuration of the NOR circuit.

Figure 28:
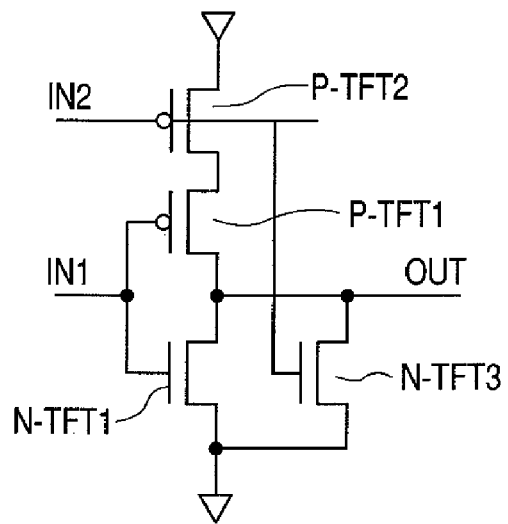
FIG. 28 is a diagram showing a NOR circuit 3 of Example 2.

Moreover, in case of using a P-type TFT with a P-type semiconductor as an active layer, instead of the N-TFT 2, two P-type TFTs, that is, the P-TFT 1 and the P-TFT 2, are brought into connection in series between the power supply and the output and the respective gates are taken as the IN 1 and IN 2, and thereby a NOR circuit can be configured (in FIG. 28).

EXAMPLE 9

Figure 29:
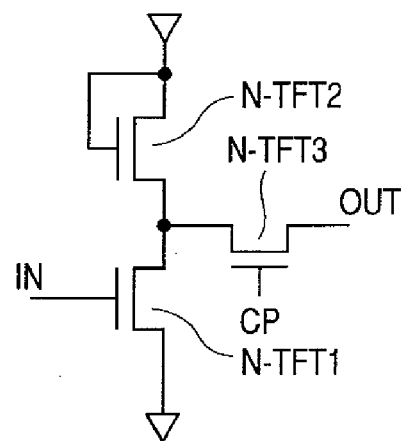
FIG. 29 is a diagram showing a clocked inverter circuit 1 of Example 3.

Clocked Inverter, Flip-flop and Shift Register Circuits with use of TFT with the Transparent Film as Active Layer Inserting an N-TFT 3 to output of an inverter with use of N-TFTs 1 and 2 with the transparent film being an N-type semiconductor as an active layer and controlling the gate with a clock signal (CP), a clocked inverter circuit of controlling by the clock signal whether to output an inverter signal or to give rise to high resistance can be configured (in FIG. 29).

Use of N-DTFT 1 with the gate and source having been short-circuited or resistance enables a configuration of the circuit of the N-TFT 2 in the clocked inverter.

Figure 30:
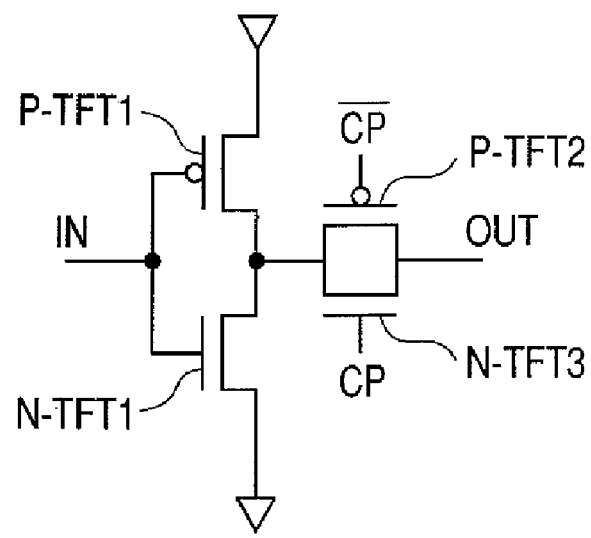
FIG. 30 is a diagram showing a clocked inverter circuit 2 of Example 3.

Moreover, in case of using a P-type TFT with a P-type semiconductor as an active layer, instead of the N-TFT 2, the P-TFT 1 with the gate having been connected to input may be used to derive the configuration. In addition, inserting the P-TFT 2 in parallel with the N-TFT 3 and controlling the gate with the inverted signal (CP barred) of the clock, output voltage amplitude can be made large (in FIG. 30).

Figure 31:
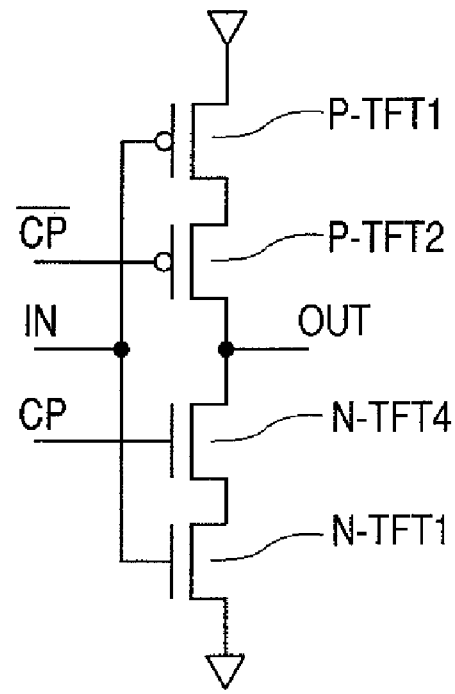
FIG. 31 is a diagram showing a clocked inverter circuit 3 of Example 3.

In addition, in case of using the P-type TFT, besides the configuration, connecting, for the inverter (in FIG. 22) with use of the P-type TFT, the P-TFT 2 in series between the PTFT-1 and output, connecting the N-TFT 4 in series between the NTFT-1 and output and controlling the gate of the P-TFT 2 with CP barred and the gate of the N-TFT 4 with CP, a clocked inverter can be configured (in FIG. 31).

Use of the inverter and clocked inverter will make it possible to configure a flip-flop.

Figure 32:
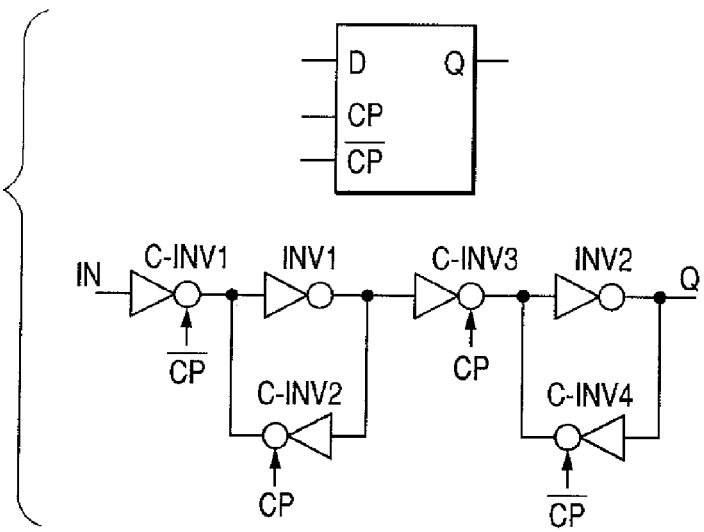
FIG. 32 is a diagram showing a D flip-flop of Example 3.

For example, in D-flip-flop, the input IN thereof will be made to be a clocked inverter (C-INV 1) controlled by CP barred and output of the C-INV 1 is connected to input of the inverter (INV 1). Output of the INV 1 is controlled with CP and is brought into connection to input of the clocked inverter (C-INV 2) to which the input and output of the inverter INV 1 are connected and to input of the clocked inverter (C-INV 3) likewise controlled with CP. The output of the C-INV 3 is connected to the input of the inverter (INV 2). The output of the INV 2 is controlled with the CP barred, is connected to the input of the clocked inverter (C-INV 2) to which the input and the output of the INV 1 are connected and will become an output Q of the D-flip-flop (in FIG. 32).

Figure 33:
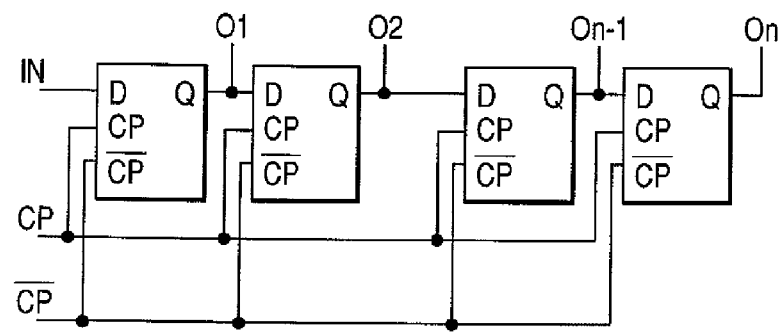
FIG. 33 is a diagram showing a shift register of Example 3.

Use of the flip-flop will make it possible to configure a shift register (in FIG. 33).

EXAMPLE 10

1-Bit SRAM Cell Circuit with use of TFT with the Transparent Film as Active Layer Using an N-TFT with the transparent film being an N-type semiconductor as an active layer and the inverter circuit, a 1-bit SRAM cell circuit can be configured.

Figure 34:
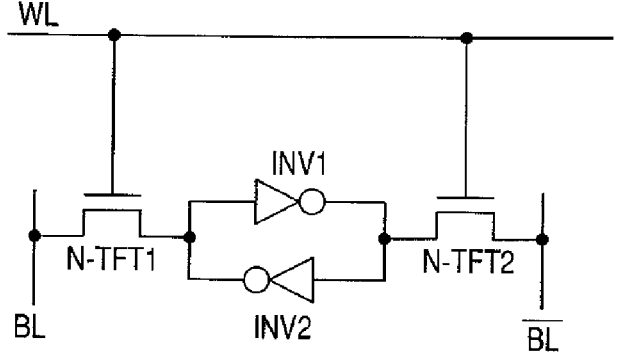
FIG. 34 is a diagram showing a 1-bit SRAM cell circuit 1 of Example 4.

The 1-bit SRAM cell circuit comprises two inverters INV 1 and INV 2, in the two inverters, the output of the INV 1 is connected to the input of the INV 2, the output of the INV 2 is connected to the input of the INV 1, and it comprises an N-TFT 1 with its gate being connected to the word line WL and present between the output of the INV 2 and the bit line BL and an N-TFT 2 with its gate being connected to the word line WL and present between the output of the INV 1 and the inverted bit line BL barred (in FIG. 34).

Figure 35:
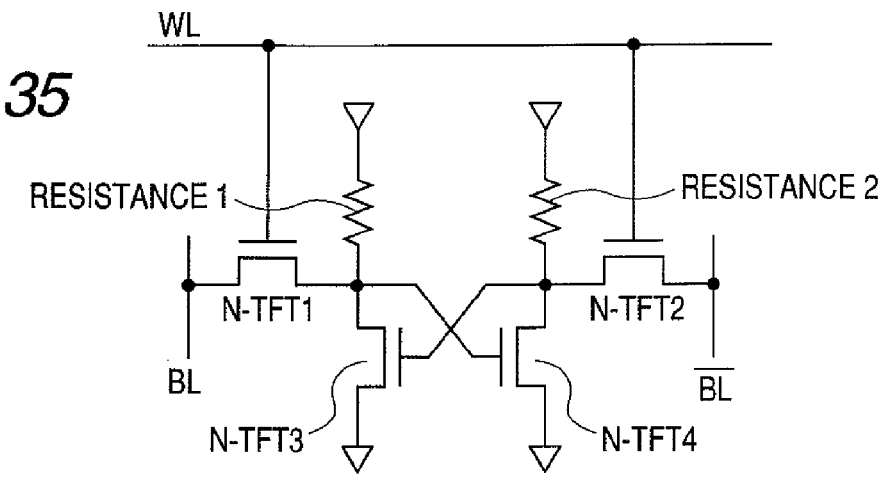
FIG. 35 is a diagram showing a 1-bit SRAM cell circuit 2 of Example 4.
Figure 36:
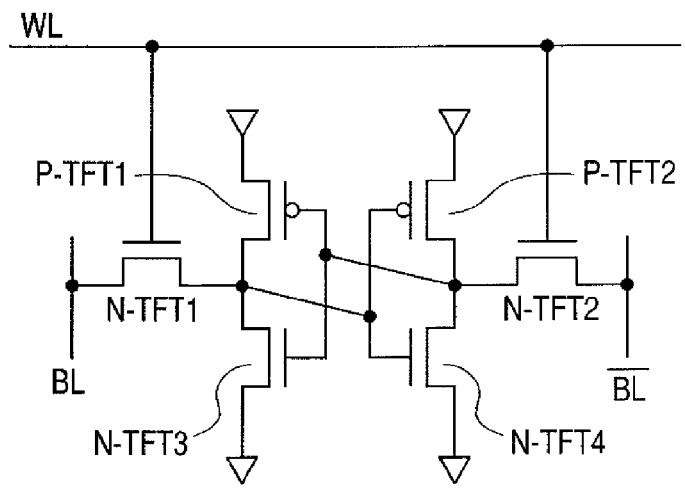
FIG. 36 is a diagram showing a 1-bit SRAM cell circuit 3 of Example 4.

For the inverter in the SRAM cell circuit, an inverter shown in the Example 1 can be used. FIG. 35 shows a configuration in case of adopting an inverter with use of the N-TFTs and resistance and FIGS. 36 shows a configuration in case of adopting an inverter with use of the N-TFTs and P-TFTs.

EXAMPLE 11

Figure 37:
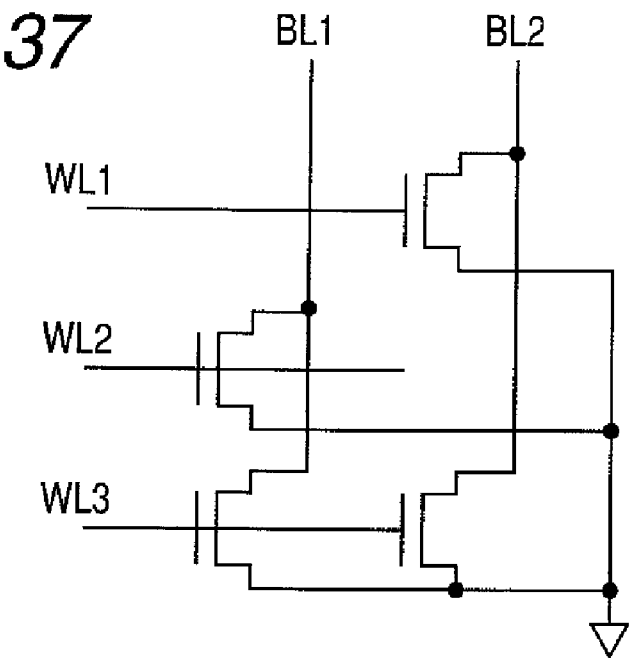
FIG. 37 is a diagram showing a NOR type ROM circuit 1 of Example 5.

NOR-type ROM Circuit with use of TFT with the Transparent Film as Active Layer A NOR-type ROM circuit of the present Example comprises a plurality of word lines (WL1 to WL3) and a plurality of bit lines (BL1 to BL2), and the bit lines are respectively provided with a plurality of N-TFTs with the transparent film to the gate of which the word lines are connected, the source of which are connected to the GND and the drain of which is connected in parallel. However, without comprising N-TFT corresponding to the word line WL1 for the bit lines BL1, the circuit does not comprise an N-TFT corresponding to the word line WL2 for the bit line BL2 (in FIG. 37).

The ROM circuit is at first precharged to a high level, and thereafter a high level or low level voltage is applied to respective word lines so that only a particular bit line can be set to a low level (GND level) voltage. For example, in case of WL1 being high and WL2 and WL3 being low, BL1 will remain high, but BL2 will become low. Thus, memory operations that the signal level of the bit lines are determined depending on presence of an N-TFT corresponding to the word lines are realized.

The ROM circuit enables further multi-bit memory operations by increasing the word lines, bit lines and N-TFTs in number.

Moreover, the ROM circuit can operate rapidly since it is a NOR type that each bit line is discharged by one N-TFT, but on the other hand, occupies a wide area since it requires a great number of contacts.

The NOR-type ROM circuit stores data based on whether or not N-TFT is formed, but after making a substrate, a NOR-type ROM circuit that can undergo writing of data with light (ultraviolet light) can be realized.

For the N-TFT, carriers are formed with oxygen deficiency in the transparent film, but implementing heat anneal in an atmosphere containing oxygen, for example, heat anneal at 150° C. for around 2 hours, the oxygen deficiency in the transparent film can be fulfilled to decrease conductivity of the transparent film so that the N-TFT will not be turned ON, that is, will no longer implement TFT operations. Thereafter, irradiation of light (UV light) from the rear side will regenerate oxygen deficiency in the transparent film and the N-TFT will be turned ON, that is, will become capable of TFT operations.

Figure 38:
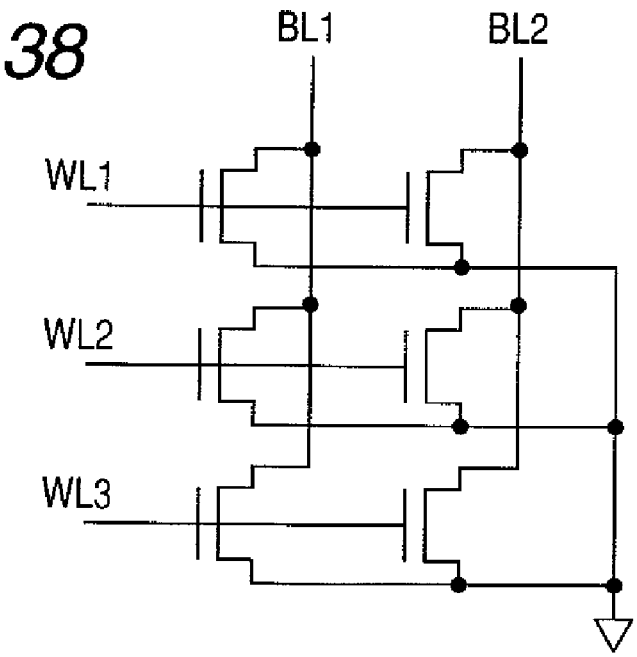
FIG. 38 is a diagram showing the first stage of making a NOR type ROM circuit 2 of Example 5.
Figure 39:
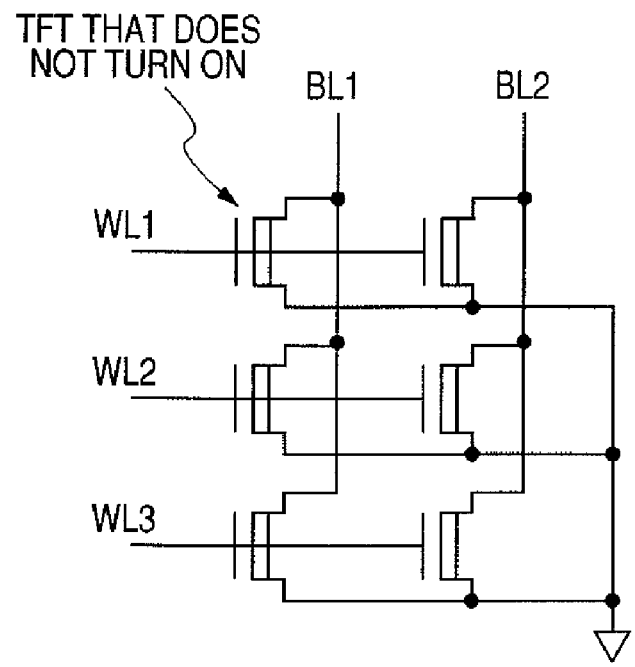
FIG. 39 is a diagram showing the second stage of making the NOR type ROM circuit 2 of Example 5.
Figure 40:
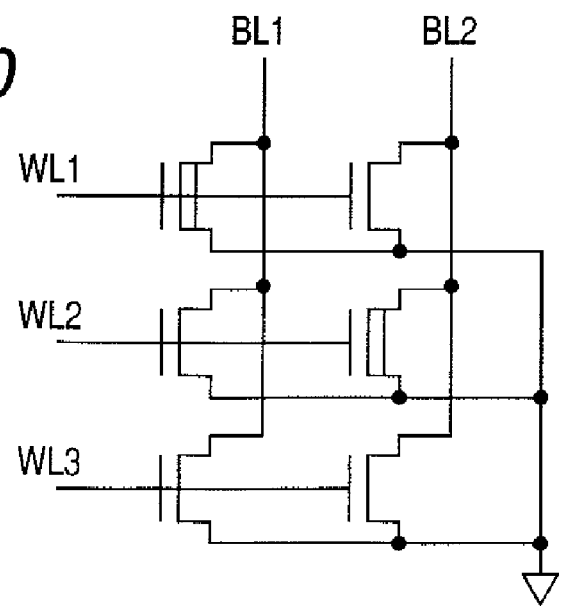
FIG. 40 is a diagram showing a NOR type ROM circuit 2 of Example 5.

Accordingly, at first, after N-TFTs corresponding to all the word lines are formed (in FIG. 38), heat annealing will make it impossible for all the N-TFT to be turned ON (FIG. 39). Subsequently, preparing a mask that passes light only in portions of the N-TFTs that should be become operable, light (UV light) is irradiated via the from the rear side. Thereby, among the N-TFTs, only N-TFTs having undergone irradiation of light will operate (FIG. 40). Thus, a NOR-type ROM circuit can be configured.

The ROM circuit that enables data writing with the light can undergo writing of different data only by replacing the mask on the same substrate, and the data once written can undergo deletion/rewriting by implementing heat anneal again.

EXAMPLE 12

Figure 41:
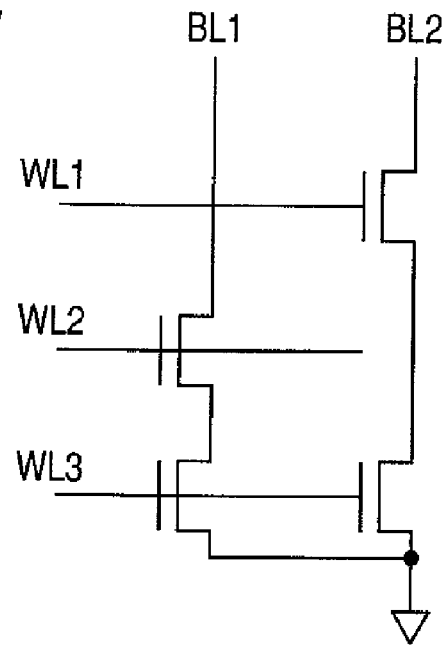
FIG. 41 is a diagram showing a NAND type ROM circuit 1 of Example 6.

NAND-type ROM Circuit with use of TFT with the Transparent Film as Active Layer A NAND-type ROM circuit of the present Example comprises a plurality of word lines (WL1 to WL3) and a plurality of bit lines (BL1 to BL2). Moreover, it is configured by an N-TFT with use of the transparent film with the WL2 being connected to the gate and the drain being connected to the BL1; an N-TFT connected in series thereto with use of the transparent film with the WL3 being connected to the gate and the source being connected to the GND; an N-TFT with use of the transparent film with the WL1 being connected to the gate and the drain being connected to the BL2; and an N-TFT connected in series thereto with use of the transparent film with the WL3 being connected to the gate and the source being connected to the GND (in FIG. 41).

The ROM circuit is at first precharged to a high level, and thereafter a high level or low level voltage is applied to respective word lines so that only a particular bit line can be set to a low level (GND level) voltage. For example, in case of WL1 being low and WL2 and WL3 being high, BL1 will become low, but BL2 will remain high. Thus, memory operations that the signal level of the bit lines are determined depending on presence of an N-TFT corresponding to the word lines are realized.

The ROM circuit enables further multi-bit memory operations by increasing the word lines, bit lines and N-TFTs in number.

Moreover, the ROM circuit will operate slowly since it is a NAND type that each bit line is discharged by a plurality of N-TFTs connected in series, but on the other hand, can be made to occupy a small area due to few contacts.

Figure 42:
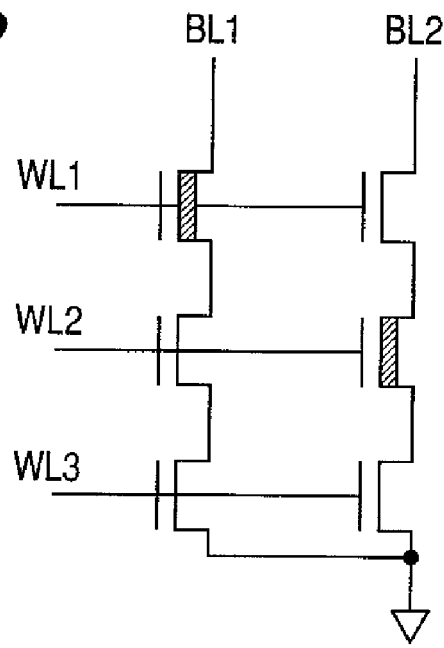
FIG. 42 is a diagram showing a NAND type ROM circuit 2 of Example 6.

In addition, the same functions of the ROM circuit can be configured by using the N-TFTs and depletion-type TFTs as well (in FIG. 42).

EXAMPLE 13

Differential Amplifier Circuit with use of TFT with the Transparent Film as Active Layer Using an N-TFT with the transparent film being an N-type semiconductor as an active layer and resistance, a differential amplifier circuit can be configured.

Figure 43:
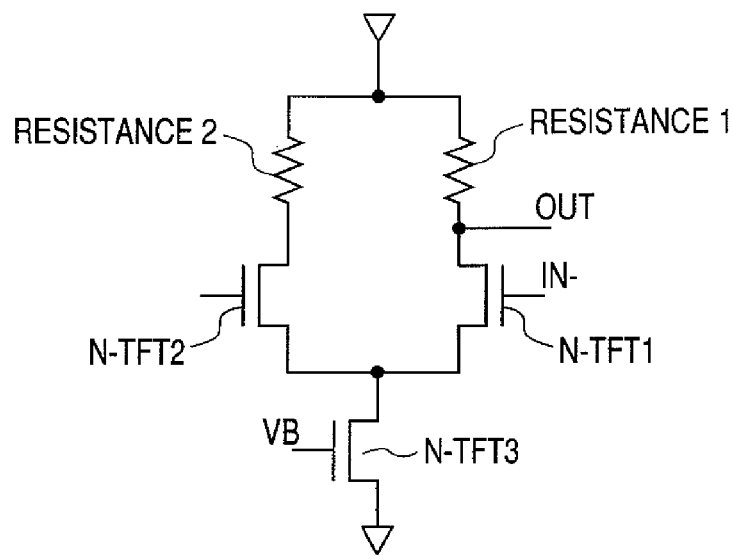
FIG. 43 is a diagram showing a differential amplifier circuit 1 of Example 7.

A differential amplifier circuit can be configured by comprising an N-TFT 3 with use of the transparent film with the source being connected to the GND and the gate to which constant voltage VB is applied; an N-TFT 1 and an N-TFT 2 with the sources being connected to the N-TFT 3 and with the gates being taken as input IN+ and IN−; resistance 1 with one end being connected to the power supply and the other end being connected to the drain of the N-TFT 1; and resistance 2 with one end being connected to the power supply and the other end being connected to the drain of the N-TFT 2, wherein the drain of the N-TFT 2 is taken as output (FIG. 43).

The differential amplifier circuit can be used for a sense amplifier of the SRAM and is a basic component of an analog circuit.

Figure 44:
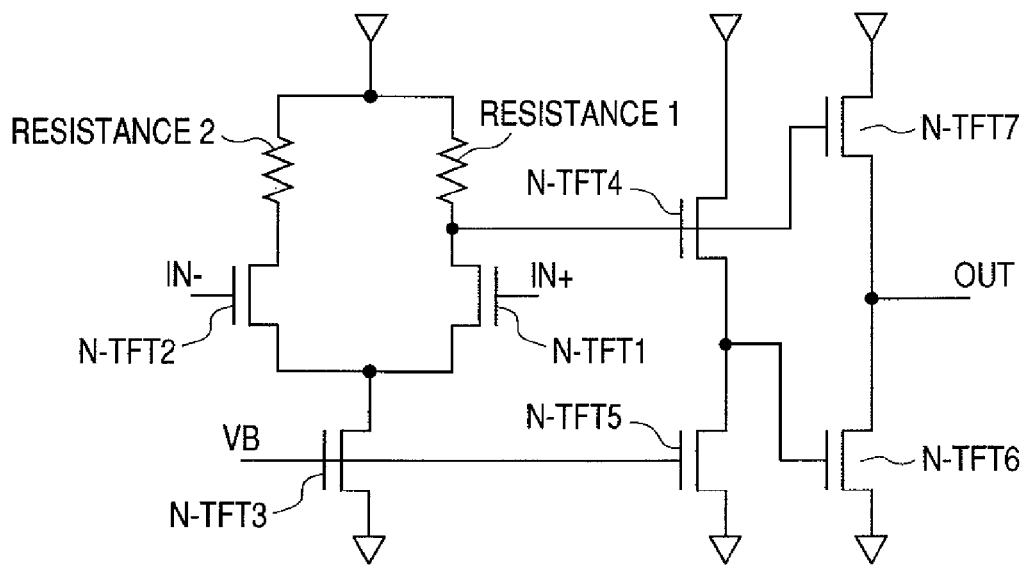
FIG. 44 is a diagram showing a differential amplifier circuit 2 of Example 7.

Moreover, capability of driving loads can be made to increase by configuring a new differential amplifier circuit by adding an N-TFT 4 with the source being connected to the ground from the differential amplifier circuit and the gate to which constant voltage VB is applied; a level shift stage configured by an N-TFT 5 with the source being connected to the drain of the N-TFT 4, the drain being connected to the power supply, and the gate being connected to the output of the differential amplifier circuit; an N-TFT 6 with the source being connected to the ground and the gate being connected to the drain of the N-TFT 4 of the level shift stage; and an output stage configured by an N-TFT 7 with the source being connected to the drain of the N-TFT 6, the drain being connected to the power supply and the gate being connected to the output of the differential amplifier circuit, wherein all the output is in the drain of the N-TFT 6 (in FIG. 44).

EXAMPLE 14

ID Tag with use of TFT with the Transparent Film as Active Layer

Using an N-TFT with the transparent film being an N-type semiconductor as an active layer, the logic circuit, memory circuit and differential amplifier circuit, a circuit required for IC cards and ID tags that operate at a slow speed of not more than several MHz can be configured.

Figure 45:
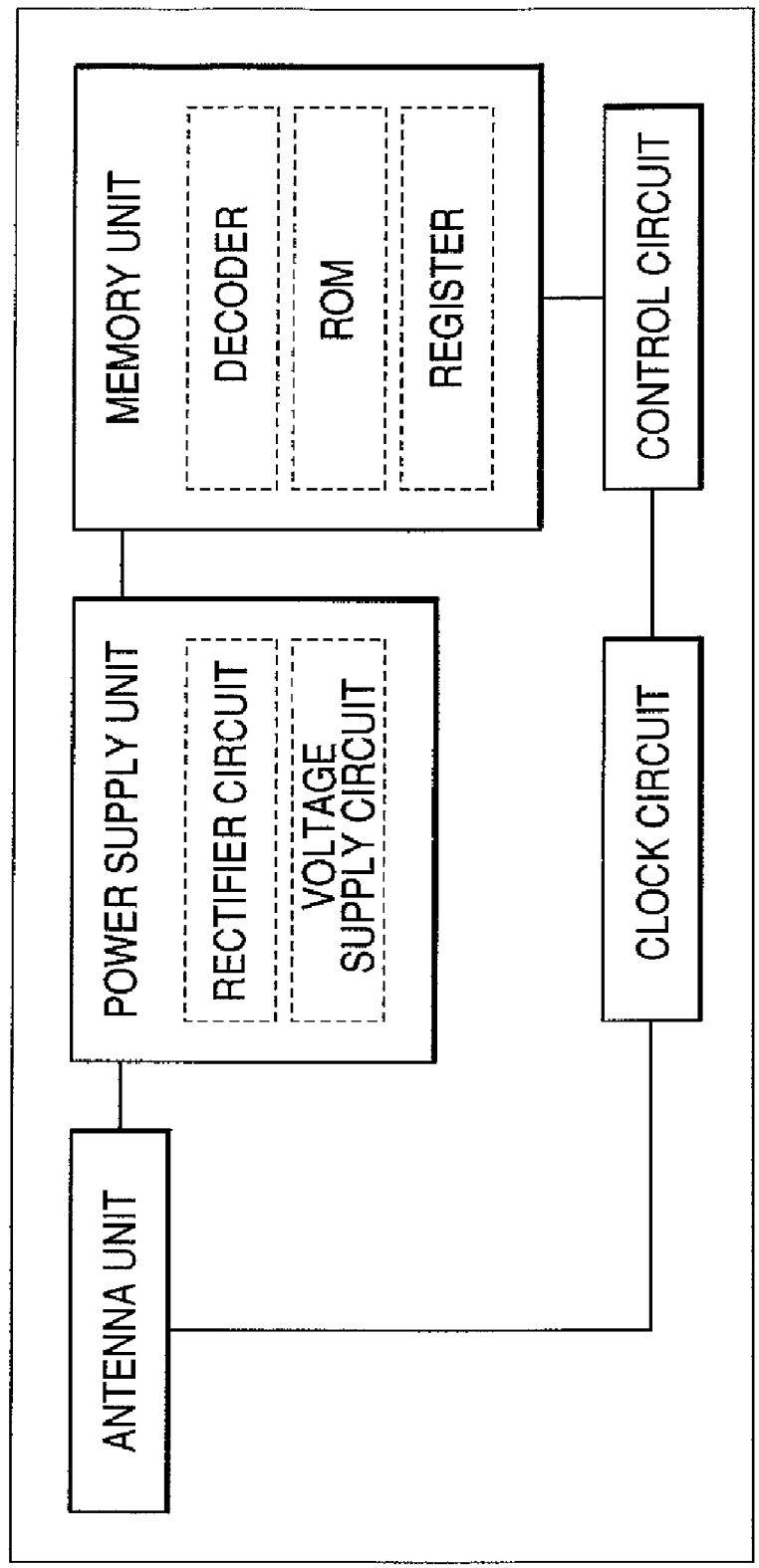
FIG. 45 is a diagram showing an N-TFT of Example 8.

FIG. 45 shows a block diagram of an RF-ID tag as an example. The ID tag is configured by an antenna unit, a power supply unit, a memory unit, a control circuit and a clock circuit. The power supply unit is configured by rectifier circuit of rectifying an AC signal only to the positive side and a voltage supply circuit of supplying appropriate voltage to a circuit, and the memory unit is configured by a decoder circuit, a ROM circuit and a register circuit.

The rectifier circuit requires a diode, but may be substituted by an element including an N-TFT using the transparent film with its gate and drain being connected. In addition, the voltage supply circuit can be configured by a regulator with use of the differential amplifier circuit shown in the Example 7.

On the other hand, the decoder circuit can be configured by the logic circuit shown in the Examples selected from the group consisting of inverter, NAND and NOR etc. and the register circuit can be configured by the flip-flop shown in the Examples.

EXAMPLE 15

Display Backplane with use of TFT with the Transparent Film as Active Layer

Figure 46:
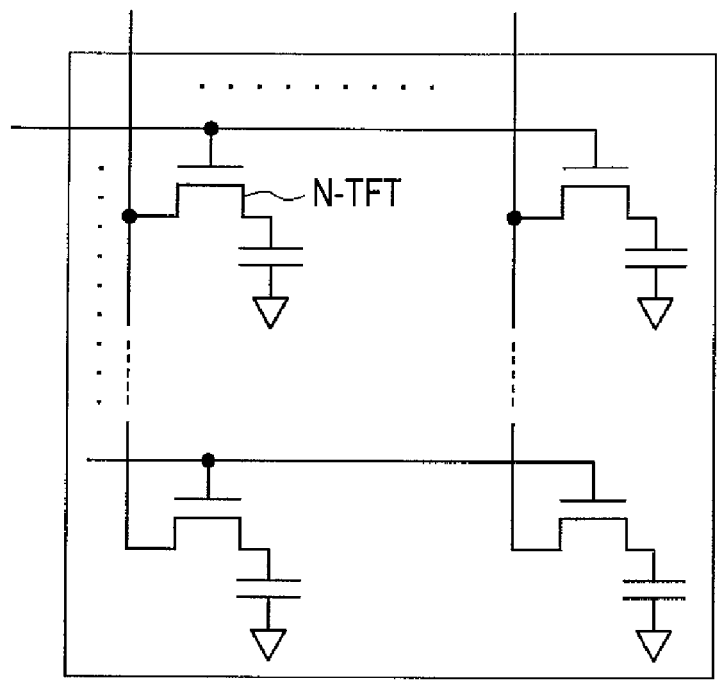
FIG. 46 is a diagram showing an active matrix backplane of Example 9.

Using, as active matrix, an N-TFT with the transparent film being an N-type semiconductor as an active layer, display backplane with the TFT being transparent can be formed (in FIG. 46). In case of using transparent material for a substrate, the TFT unit of the backplane will become transparent, enabling increase in aperture ratio of LCDs and organic EL displays as well as light emission from the substrate side.

Transparent oxide film related to the present invention, semiconductor elements and circuits with use of the film can be widely applied to switching element of LCDs and organic EL displays and to components not only to flexible display with flexible material including plastic film as substrates but also to IC cards and ID tags etc.

This application claims priority from Japanese Patent Application No. 2004-326685 filed Nov. 10, 2004, which is hereby incorporated by reference herein.

What is claimed is:

1. An integrated circuit comprising a P-type TFT and an N-type TFT,
    wherein the N-type TFT comprises an amorphous oxide of a compound having
    (a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
    (b) an electron carrier concentration of greater than $10^{12}/cm^3$; and
    (c) oxygen defect density decreased by treatment in an atmosphere including oxygen at a predetermined pressure during or after formation of a film of the amorphous oxide.

2. The integrated circuit according to claim 1, wherein said amorphous oxide contains at least one of In, Zn, and Sn.

3. The integrated circuit according to claim 1, wherein said amorphous oxide is at least an oxide containing In, Zn, and Sn, an oxide containing In and Zn, oxides containing In and Sn, and an oxide containing In.

4. The integrated circuit according to claim 1, wherein said amorphous oxide is an oxide containing In, Ga, and Zn.

5. The integrated circuit according to claim 1, wherein a P-type semiconductor having an absolute value of Fermi level being larger than an absolute value of Fermi level of said amorphous oxide in said N-type TFT is used as a material in said P-type TFT.

6. An integrated circuit, comprising a circuit, which includes an N-type TFT using amorphous oxide of a compound having
    (a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
    (b) an electron carrier concentration of greater than $10^{12}/cm^3$ and less than $10^{18}/cm^3$, wherein an N-type semiconductor has less than 10 micro-ampere of current between drain and source terminals when no gate voltage is applied; and
    (c) oxygen defect density decreased by treatment in an atmosphere including oxygen at a predetermined pressure during or after formation of a film of the amorphous oxide.

7. The integrated circuit according to claim 6, wherein the N-type TFT is used in at least any of a logic circuit, a memory circuit, and a differential amplifier circuit.

8. The integrated circuit of claim 6 when the amorphous oxide contains a group IV element M4, wherein M4 is selected from the group consisting of Sn, Si, Ge, and Zr.

9. An integrated circuit comprising a first region, a second region and an N-type TFT, the first region and the second region form a heterojunction, and the first region and an active layer of the N-type TFT contain an amorphous oxide satisfying the following conditions (a), (b), and (c)
    (a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
    (b) an electron carrier concentration of greater than $10^{12}/cm^3$ and less than $10^{18}/cm^3$; and
    (c) oxygen defect density decreased by treatment in an atmosphere including oxygen at a predetermined pressure during or after formation of a film of the amorphous oxide.

10. The integrated circuit according to claim 9, wherein said amorphous oxide is at least an oxide containing In, Zn, and Sn, an oxide containing In and Zn, an oxide containing In and Sn, and an oxide containing In.

11. The integrated circuit according to any one of claims 1 and 9, wherein the amorphous oxide contains a group-IV element M4, wherein M4 is selected from the group consisting of Sn, Si, Ge, and Zr.

12. An integrated circuit comprising a P-type region and an N-type region, wherein the N-type region comprises an N-type TFT comprising an amorphous oxide of a compound having
    (a) the amorphous oxides are any of oxides containing In, Ga and Zn, oxides containing In, Zn, and Sn, oxides containing In and Zn, oxides containing In and Sn, and oxides containing In;
    (b) an electron carrier concentration of greater than $10^{12}/cm^3$ and less than $10^{18}/cm^3$, wherein an electron mobility of the amorphous oxide increases when the electron carrier concentration increases; and (c) oxygen defect density decreased by treatment in an atmosphere including oxygen at a predetermined pressure during or after formation of a film of the amorphous oxide.

13. An integrated circuit, comprising a circuit, which includes an N-type TFT using amorphous oxide of a compound having
- (a) the amorphous oxides are any of oxides containing In, Ga and Zn, oxides containing In, Zn, and Sn, oxides containing In and Zn, oxides containing In and Sn, and oxides containing In;
- (b) an electron carrier concentration of greater than $10^{12}/cm^3$ and less than $10^{18}/cm^3$, wherein an electron mobility of the amorphous oxide increases when the electron carrier concentration increases as an N-type semiconductor and which has less than 10 micro-ampere of current between drain and source terminals when no gate voltage is applied; and
- (c) oxygen defect density decreased by treatment in an atmosphere including oxygen at a predetermined pressure during or after formation of a film of the amorphous oxide.

14. An integrated circuit comprising a first region, a second region and an N-type TFT, the first region and the second region form a heterojunction, and the first region and an active layer of the N-type TFT contain an amorphous oxide satisfying the following conditions (a), (b) and (c)
- (a) the amorphous oxides are any of oxides containing In, Ga, and Zn, oxides containing In, Zn and Sn, oxides containing In and Zn, oxides containing In and Sn, and oxides containing In;
- (b) an electron carrier concentration of greater than $10^{12}/cm^3$ and less than $10^{18}/cm^3$, wherein an electron mobility of the amorphous oxide increases when the electron carrier concentration increases, and a second region forming a heterojunction to said first region; and
- (c) oxygen defect density decreased by treatment in an atmosphere including oxygen at a predetermined pressure during or after formation of a film of the amorphous oxide.

\* \* \* \* \*